(12) United States Patent
Oh et al.

(10) Patent No.: US 11,791,013 B2
(45) Date of Patent: Oct. 17, 2023

(54) STORAGE DEVICES AND METHODS OF OPERATING STORAGE DEVICES

(71) Applicant: Samsung Electronics Co., Ltd., Suwon-si (KR)

(72) Inventors: Seungjun Oh, Seongnam-si (KR); Jihwa Lee, Namyangju-si (KR); Kyungduk Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 17/382,868

(22) Filed: Jul. 22, 2021

(65) Prior Publication Data
US 2022/0197541 A1 Jun. 23, 2022

(30) Foreign Application Priority Data
Dec. 23, 2020 (KR) .......................... 10-2020-0181841

(51) Int. Cl.
*G11C 29/02* (2006.01)
*G11C 29/00* (2006.01)
(Continued)

(52) U.S. Cl.
CPC .......... *G11C 29/702* (2013.01); *G06F 3/0679* (2013.01); *G11C 29/022* (2013.01);
(Continued)

(58) Field of Classification Search
CPC ................ G11C 29/702; G11C 29/022; G11C 29/12005; G11C 29/1201; G11C 29/48;
(Continued)

(56) References Cited

U.S. PATENT DOCUMENTS 6,008,664 A 12/1999 Jett et al.
6,026,039 A 2/2000 Kim et al.
(Continued)

FOREIGN PATENT DOCUMENTS

KR 10-0399914 B1 7/2002
KR 10-2004-0063576 A 7/2004
KR 10-2014-0082195 A 7/2014

*Primary Examiner* — Jay W. Radke
(74) *Attorney, Agent, or Firm* — Harness, Dickey & Pierce, P.L.C.

(57) ABSTRACT

A storage device includes a plurality of nonvolatile memory devices, a storage controller circuit and a leakage detection circuit. The storage controller circuit controls a plurality of nonvolatile memory devices, the storage controller circuit includes a plurality of connection terminals, each of the plurality of connection terminals is commonly connected to a corresponding set of pins, from among the pluralities of pins included in the plurality of nonvolatile memory devices, via a corresponding connection node, from among a plurality of connection nodes. The pins included in each set of pins have a same attribute. The leakage detection circuit is configured to determine whether leakage occurs at each set of pins based on the merged signal generated by the connection node connected to each set of pins, and configured to provide the storage controller circuit with a detection signal indicating a result of the determination.

20 Claims, 22 Drawing Sheets

(51) Int. Cl.
  *G06F 3/06* (2006.01)
  *G11C 29/12* (2006.01)
  *G11C 29/48* (2006.01)
  *G01R 31/52* (2020.01)

(52) U.S. Cl.
  CPC .... *G11C 29/1201* (2013.01); *G11C 29/12005* (2013.01); *G11C 29/48* (2013.01); *G01R 31/52* (2020.01)

(58) Field of Classification Search
  CPC ......... G11C 5/147; G11C 16/30; G11C 29/42; G11C 29/025; G11C 7/1045; G11C 29/028; G06F 3/0679; G01R 31/52; G01R 31/3008
  See application file for complete search history.

(56) References Cited

U.S. PATENT DOCUMENTS

| | | | |
|---|---|---|---|
| 7,036,055 | B2 | 4/2006 | Muljono et al. |
| 9,583,214 | B2 | 2/2017 | You et al. |
| 10,078,567 | B2 | 9/2018 | Li |
| 2022/0046789 | A1* | 2/2022 | Park ................... H05K 1/0228 |

* cited by examiner

FIG. 6

| | | | | |
|---|---|---|---|---|
| 74 | N/C(or 3.3V) | | 75 | GND |
| 72 | N/C(or 3.3V) | | 73 | GND |
| 70 | N/C(or 3.3V) | | 71 | GND |
| 68 | SUSCLK(32kHz) | | 69 | PEDET | N/C |
| 66 | ///// | | 67 | |
| 64 | ///// | | 65 | ///// |
| 62 | ///// | | 63 | ///// |
| 60 | ///// | | 61 | ///// |
| | | | 59 | ///// |
| 58 | Reserved MFG_CLOCK | | 57 | GND |
| 56 | Reserved MFG_DATA | | 55 | N/C | REFCLKp |
| 54 | N/C | PEWAKE# | 53 | N/C | REFCLKn |
| 52 | N/C | CLKREQ# | 51 | GND |
| 50 | N/C | PERST#0 | 49 | SATA-A+ | PERp0 |
| 48 | | | 47 | SATA-A- | PERn0 |
| 46 | | | 45 | GND |
| 44 | N/C | ALERT#(0) | 43 | SATA-B+ | PETp0 |
| 42 | SMB_DATA(I/O)(0/1.8V) | | 41 | SATA-B- | PETn0 |
| 40 | SMB_CLK(I/O)(0/1.8V) | | 39 | GND |
| 38 | DEVSLP/PWDIS | NC | 37 | N/C | PERp1 |
| 36 | 12V(Pre-Charge)(or N/C) | | 35 | N/C | PERn1 |
| 34 | 12V(or N/C) | | 33 | GND |
| 32 | 12V(or N/C) | | 31 | N/C | PETp1 |
| 30 | 12V(or N/C) | | 29 | N/C | PETn1 |
| 28 | | | 27 | GND |
| 26 | GND(or N/C) | | 25 | N/C | PERp2 |
| 24 | | | 23 | N/C | PERn2 |
| 22 | | | 21 | GND |
| 20 | GND(or N/C) | | 19 | N/C | PETp2 |
| 18 | N/C(or 3.3V) | | 17 | N/C | PETn2 |
| 16 | N/C(or 3.3V) | | 15 | GND |
| 14 | N/C(or 3.3V) | | 13 | N/C | PERp3 |
| 12 | 3.3V | | 11 | N/C | PERn3 |
| 10 | DAS/DSS#(I/O) | LED1# | 9 | GND |
| 8 | | | 7 | N/C | PETp3 |
| 6 | | | 5 | N/C | PETn3 |
| 4 | N/C(or 3.3V) | | 3 | GND |
| 2 | N/C(or 3.3V) | | 1 | GND |

KEY: pins 60, 62, 64, 66 (left) and 59, 61, 63, 65 (right)

| PIN NAME | DESCRIPTION |
|---|---|
| RnB | READY, BUSY STATUS OUT |
| nRE | READ ENABLE |
| nCE | CHIP ENABLE |
| Vcc | POWER SUPPLY |
| Vss | GROUND |
| CLE | COMMAND LATCH ENABLE |
| ALE | ADDRESS LATCH ENABLE |
| nWE | WRITE ENABLE |
| nWP | WRITE PROTECTION |
| DQ0~DQ7 | DATA INPTU & OUTPUT |
| DQS | DATA STROBE |

| PIN | STATE(IDLE) | P/F | REPLACEABLE | OP_MODE |
|---|---|---|---|---|
| CE0P | 'H' | F | X | - |
| CE1P | 'H' | F | X | - |
| CE2P | H | F | X | - |
| CE3P | H | F | X | - |
| CLEP | L | F | X | - |
| ALEP | L | F | X | - |
| WEBP | H | | | |
| REBP | H | P(F) | 0 | DIFFERENTIAL -->CMOS |
| REP | L | F(P) | | |
| DQSBP | H | P(F) | 0 | DIFFERENTIAL -->CMOS |
| DQSP | L | F(P) | | |
| RnBP | H | F | 0 | POLLING -->COMMAND STATUS |
| DQ0P | L | ONE FAIL OF EIGHT | DQ0P:FAIL X8 MODE-->X4 MODE(DQ4~DQ7) DQ6P:FAIL X8 MODE-->X4 MODE(DQ0~DQ3) | |
| DQ1P | L | | | |
| DQ2P | L | | | |
| DQ3P | L | | | |
| DQ4P | L | | | |
| DQ5P | L | | | |
| DQ6P | L | | | |
| DQ7P | L | | | |

S200a

S200b

STORAGE DEVICES AND METHODS OF OPERATING STORAGE DEVICES

CROSS-REFERENCE TO RELATED APPLICATIONS

This application claims the priority under 35 USC § 119 to Korean Patent Application No. 10-2020-0181841, filed on Dec. 23, 2020 in the Korean Intellectual Property Office, the disclosures of which are incorporated herein by reference in their entireties.

TECHNICAL FIELD

At least some example embodiments relate generally to storage, and more particularly to storage devices and methods of operating storage devices.

DISCUSSION OF THE RELATED ART

Storage devices are devices for storing data according to control of host devices such as a computer, a smart phone, and/or a smart pad. The storage devices include a device for storing data on a magnetic disk, such as a hard disk drive (HDD), and a device for storing data on a semiconductor memory, such as a solid state drive (SSD) and a memory card, that is, a non-volatile memory.

Use of a storage device including a non-volatile memory is expanding from personal computers to business computers such as a data server. With the expansion of use of a storage device, various functions and form factors of storage devices are required in individual fields. A storage device is connected to various hosts and transmits high-frequency signals to a host, and thus a storage controller in the storage device performs a parallel communication with storages to provide data to the storage.

SUMMARY

At least some example embodiments of the inventive concepts provide a storage device capable of detecting defects in general purpose input/output (GPIO) pins of nonvolatile memory devices and operating the nonvolatile memory devices without being affected by the defects in the general input/output pins.

At least some example embodiments of the inventive concepts provide a method of operating a storage device, capable of detecting defects in GPIO pins of nonvolatile memory devices and operating the nonvolatile memory devices without being affected by the defects in the general input/output pins. According to some example embodiments of the inventive concepts, the storage device includes a plurality of nonvolatile memory devices, each including a plurality of pins; a storage controller circuit configured to control the plurality of nonvolatile memory devices, wherein the storage controller circuit includes a plurality of connection terminals, each of the plurality of connection terminals is commonly connected to a corresponding set of pins, from among the pluralities of pins included in the plurality of nonvolatile memory devices, via a corresponding connection node, from among a plurality of connection nodes, wherein the pins included in each set of pins have a same attribute, and wherein each connection node from among the plurality of connection nodes is configured to generate a merged signal by merging a plurality of signals; and a leakage detection circuit configured to determine whether leakage occurs at each set of pins based on the merged signal generated by the connection node connected to each set of pins, and configured to provide the storage controller circuit with a detection signal indicating a result of the determination, wherein the storage controller circuit includes a register and is further configured to store leakage information on whether the leakage occurs at each set of pins in a register inside the register, and change an operation mode of the plurality of nonvolatile memory devices based on leakage information.

According to at least some example embodiments of the inventive concepts, a method of operating a storage device, wherein the storage device includes a plurality of nonvolatile memory devices and a storage controller circuit configured to control the plurality of nonvolatile memory devices, includes checking, sequentially or concurrently, by a leakage detection circuit connected to the plurality of nonvolatile memory devices and the storage controller circuit, whether leakage occurs at each of a plurality of sets of pins, the storage controller circuit including a plurality of connection terminals, each of the plurality of connection terminals being commonly connected to each pin in a corresponding set of pins, from among the plurality of sets of pins, through a corresponding connection node, from among a plurality of connection nodes, each nonvolatile memory device from among the plurality of nonvolatile memory devices including a plurality of pins, each set of pins including pins from among the pluralities of pins included in the plurality of nonvolatile memory devices, each set of pins including pins having a same attribute; storing leakage information on whether the leakage occurs at each set of pins in a register in the storage controller circuit; and changing an operation mode of the plurality of nonvolatile memory devices based on leakage information stored in the register and whether defective pins at which the leakage occurs among the plurality of pins of each of the nonvolatile memory devices are replaceable.

According to at least some example embodiments of the inventive concepts, a storage device includes a plurality of nonvolatile memory devices provided on a printed circuit board (PCB), each including a plurality of pins; a storage controller circuit provided on the PCB, the storage controller circuit being configured to control the plurality of nonvolatile memory devices, the storage controller circuit including a plurality of connection terminals, each of the plurality of connection terminals being commonly connected to each pin in a corresponding set of pins, from among a plurality of sets of pins, through a corresponding connection node, from among a plurality of connection nodes, each nonvolatile memory device from among the plurality of nonvolatile memory devices including a plurality of pins, each set of pins including pins from among the pluralities of pins included in the plurality of nonvolatile memory devices, each set of pins including pins having a same attribute; and a leakage detection circuit provided on the PCB, the leakage detection circuit being configured to determine whether leakage occurs at each set of pins based on a corresponding merged signal from among a plurality of merged signals generated, respectively, by the plurality of connection nodes, and configured to provide the storage controller circuit with a detection signal indicating a result of the determination, wherein the storage controller circuit includes a register and is configured to store leakage information on whether the leakage occurs at each set of pins in the register, and adaptively change an operation mode of the plurality of nonvolatile memory devices based on leakage information, wherein the leakage detection circuit includes a detector circuit connected to a first node, the detector circuit being configured to generate the detection signal based on a merged signal from among the plurality of merged signals; and a plurality of selection transistors connected in parallel between the plurality of connection nodes and the first node, the storage controller circuit being further configured to sequentially turn on a plurality of selection transistors in response to a plurality of turn-on voltages, and wherein the storage controller includes a pin manager circuit including the register; and a storage controller processor configured to control the pin manager circuit and configured to adaptively change the operation mode of the plurality of nonvolatile memory devices by referring to the register.

Accordingly, in the storage device and method of operating the storage device according to at least some example embodiments of the inventive concepts, the leakage detection circuit, connected to connection nodes which are connected to connection terminals of the storage controller respectively and are connected to each set of pins of a plurality of pins of the nonvolatile memory device respectively, checks sequentially or concurrently leakage at each set of pins having same attribute and changes operation mode of the plurality of nonvolatile memory devices based on leakage information and whether defective pins at which the leakage occurs among the plurality of pins are replaceable. Therefore, the storage device may enhance performance by changing the operation mode to a mode in which the storage device is not affected by the defective pins at which the leakage occurs.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 6 illustrates connection terminals of the connector in FIGS. 5A and 5B according to at least some example embodiments of the inventive concepts.

FIG. 15 illustrates an example of the register in FIG. 13A or 13B according to at least some example embodiments of the inventive concepts.

DETAILED DESCRIPTION OF EMBODIMENTS

Figure 1:
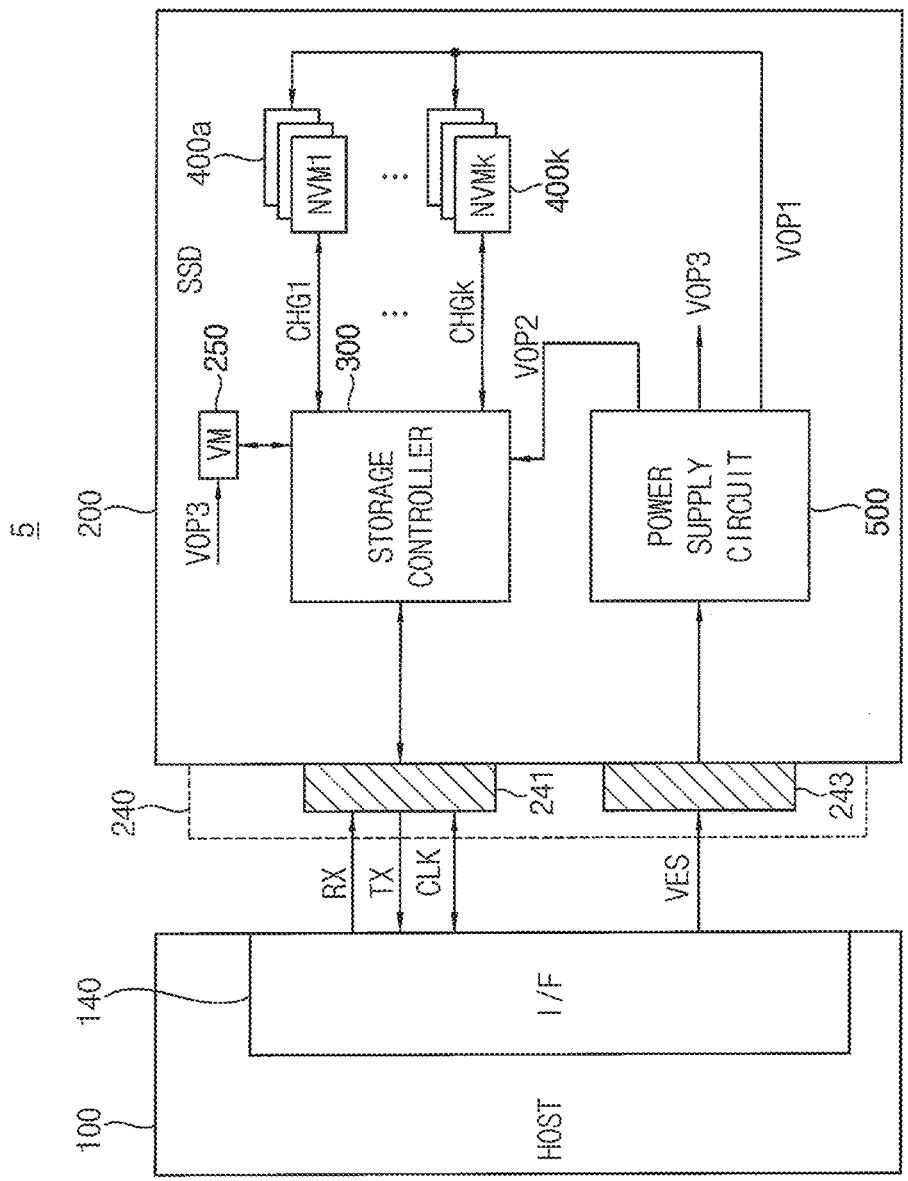
FIG. 1 is a block diagram illustrating a storage system according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a storage system according to at least some example embodiments of the inventive concepts.

Referring to FIG. 1, a storage system 5 may include a host 100 and a storage device 200. The host 100 may include a storage interface (I/F) 140.

In FIG. 1, the storage device 200 is illustrated as a solid state drive (SSD) device as an example. However, example embodiments are not limited thereto. According to some example embodiments, the storage device 200 may be any kind of storage device.

The storage device 200 may include a storage controller 300, a plurality of nonvolatile memory devices (NVM) 400a~400k (where k is an integer greater than two), a power supply circuit 500 and a connector 240. The connector 240 may include a signal connector 241 and a power connector 243. The storage device 200 may further include a volatile memory device (VM) 250. The plurality of nonvolatile memory devices 400a~400k and the volatile memory device 250 may be referred to as semiconductor memory devices.

The plurality of nonvolatile memory devices 400a~400k may be used as a storage medium of the storage device 200. In some example embodiments, each of the plurality of nonvolatile memory devices 400a~400k may include a flash memory or a vertical NAND memory device. The storage controller 300 may be coupled to the plurality of nonvolatile memory devices 400a~400k through a plurality of channels CHG1~CHGk, respectively.

The storage controller 300 may receive a reception signal RX from the host 100 may transmit a transmission signal TX to the host 100, and may exchange a clock signal CLK with the host 100 through the signal connector 241. The reception signal RX may include a command signal, an address signal and a data.

The storage controller 300 may write the data to the plurality of nonvolatile memory devices 400a~400k or read the data from plurality of nonvolatile memory devices 400a~400k based on the command signal and the address signal. That is, storage controller 300 may communicate with the host 100 through the connector 240.

Each of the nonvolatile memory devices 400a~400k may receive write data from the storage controller 300 based on a data strobe signal and data signals and may output read data to the storage controller 300 based on the data strobe signal and the data signals.

The storage controller 300 may communicate the data signals with the host 100 using the volatile memory device 250 as an input/output buffer. In some example embodiments, the volatile memory device 250 may include a dynamic random access memory (DRAM).

The power supply circuit 500 may be configured to receive a power supply voltage VES (e.g., external supply voltage) from the host 100 through the power connector 243. The power supply circuit 500 may generate adaptively at least one first operation voltage VOP1 used by the plurality of nonvolatile memory devices 400a~400k, at least one second operation voltage VOP2 used by the storage controller 300, and at least one third operation voltage VOP3 used by the volatile memory device 250 based on the power supply voltage VES.

The power supply circuit 500 may provide the at least one first operation voltage VOP1 to the plurality of nonvolatile memory devices 400a~400k, may provide the at least one second operation voltage VOP2 to the storage controller 300, and may provide the at least one third operation voltage VOP3 to the volatile memory device 250.

Figure 4:
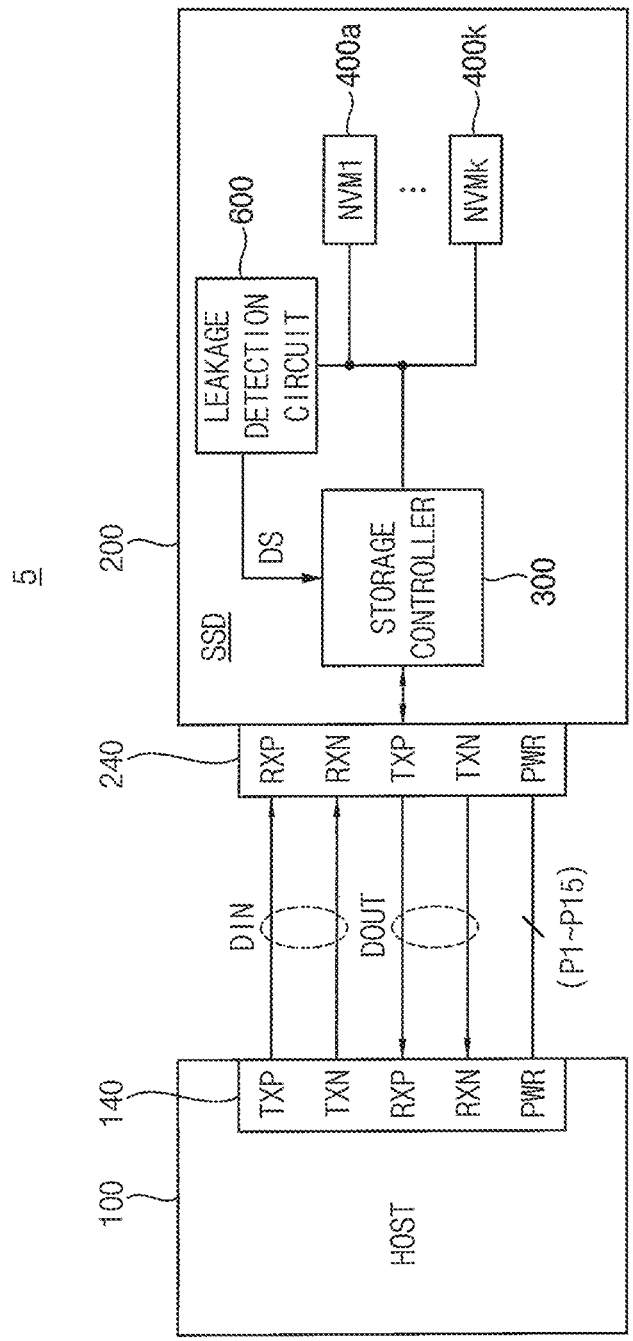
FIG. 4 is a block diagram illustrating an example of an interface for the storage system of FIG. 1 according to at least some example embodiments of the inventive concepts.

Although not illustrated, the storage controller 300 may further include a leakage detection circuit (600 in FIG. 4). The storage controller 300 may include a plurality of connection terminals, and each of the plurality of connection terminals is commonly connected to each set of pins among respective plurality of pins of each of the nonvolatile memory devices 400a~400k at respective one of a plurality of connection nodes. Each set of pins may have same attribute. Respective pin in each set of pins may be associated with same signal or same data signal. The leakage detection circuit may sequentially or concurrently check whether leakage occurs at each set of pins and may provide a result of checking to the storage controller 300. The storage controller 300 may change operation mode of the plurality of nonvolatile memory devices 400a~400k based on the result of checking.

When defective pins (degraded pins) in which the leakage occurs are replaceable, the storage controller 300 may replace the defective pins with affordable pins, and when affordable pins are not available and operation modes associated with the defective pins in which the leakage occurs are replaceable, the storage controller 300 may change the operation mode of the plurality of nonvolatile memory devices 400a~400k such that the defective pins are not to be used. The storage controller 300 may increase usability of the plurality of nonvolatile memory devices 400a~400k by changing the operating mode such that the changed operation mode is not associated with the defective pins.

Figure 2:
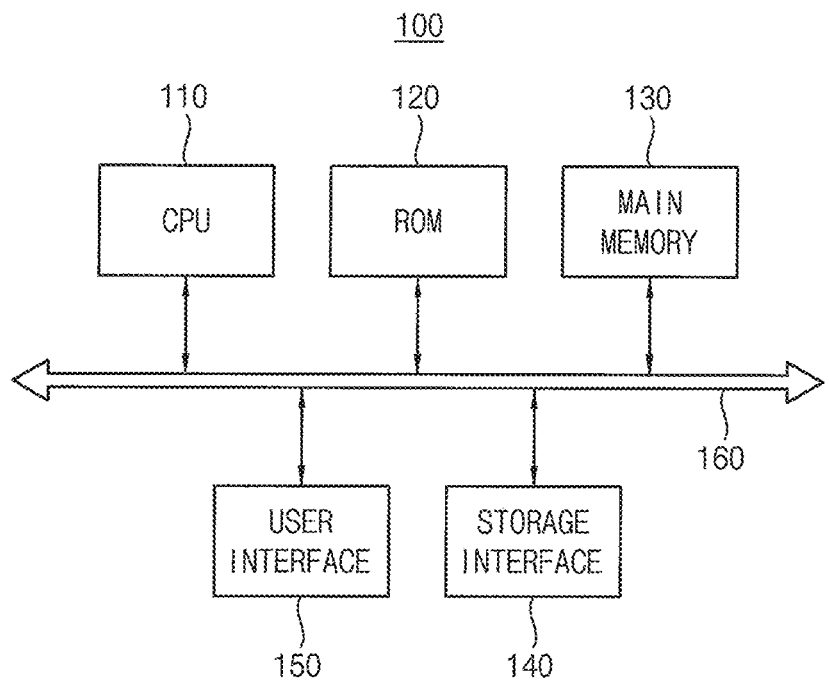
FIG. 2 is a block diagram illustrating the host of the storage system of FIG. 1 according to at least some example embodiments of the inventive concepts.

FIG. 2 is a block diagram illustrating the host of the storage system of FIG. 1 according to at least some example embodiments of the inventive concepts. Referring to FIG. 2, the host 100 may include a host processor 110, a read-only memory (ROM) 120, a main memory 130, a storage interface 140, a user interface 150 and a bus 160. According to at least some example embodiments of the inventive concepts, the host processor 110 may be or include hardware including logic circuits; a hardware/software combination executing software; or a combination thereof. For example, the host processor 110 more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc. The host processor 110 may be configured, via hardware and/or software (e.g., firmware), to perform and/or control any operation described in the specification as being performed by a host processor, a host, or an element thereof (e.g., the ROM 120, main memory 130, a storage interface 140, user interface 150 and/or bus 160). According to at least one example embodiment of the inventive concepts, the host processor 110 is a central processing unit (CPU). Further, one or both of the storage interface 140 and user interface 150 may be implemented by one or more circuits or circuitry. Accordingly, the storage interface 140 and user interface 150 may be referred to in the present specification as the storage interface circuit 140 and user interface circuit 150, respectively.

The bus 160 may refer to a transmission channel via which data is transmitted between the CPU 110, the ROM 120, the main memory 130, the storage interface 140 and the user interface 150 of the host 100.

The ROM 120 may store various application programs. For example, application programs supporting storage protocols such as Advanced Technology Attachment (ATA), Small Computer System Interface (SCSI), embedded Multi Media Card (eMMC), and/or Unix File System (UFS) protocols are stored.

The main memory 130 may temporarily store data or programs. The user interface 150 may be a physical or virtual medium for exchanging information between a user and the host device 100, a computer program, etc., and includes physical hardware and logical software. For example, the user interface 150 may include an input device for allowing the user to manipulate the host 100, and an output device for outputting a result of processing an input of the user.

The CPU 110 may control overall operations of the host 100. The CPU 110 may generate a command for storing data in the storage device 200 or a request (or a command) for reading data from the storage device 200 by using an application stored in the ROM 120, and transmit the request to the storage device 200 via the storage interface 140.

Figure 3:
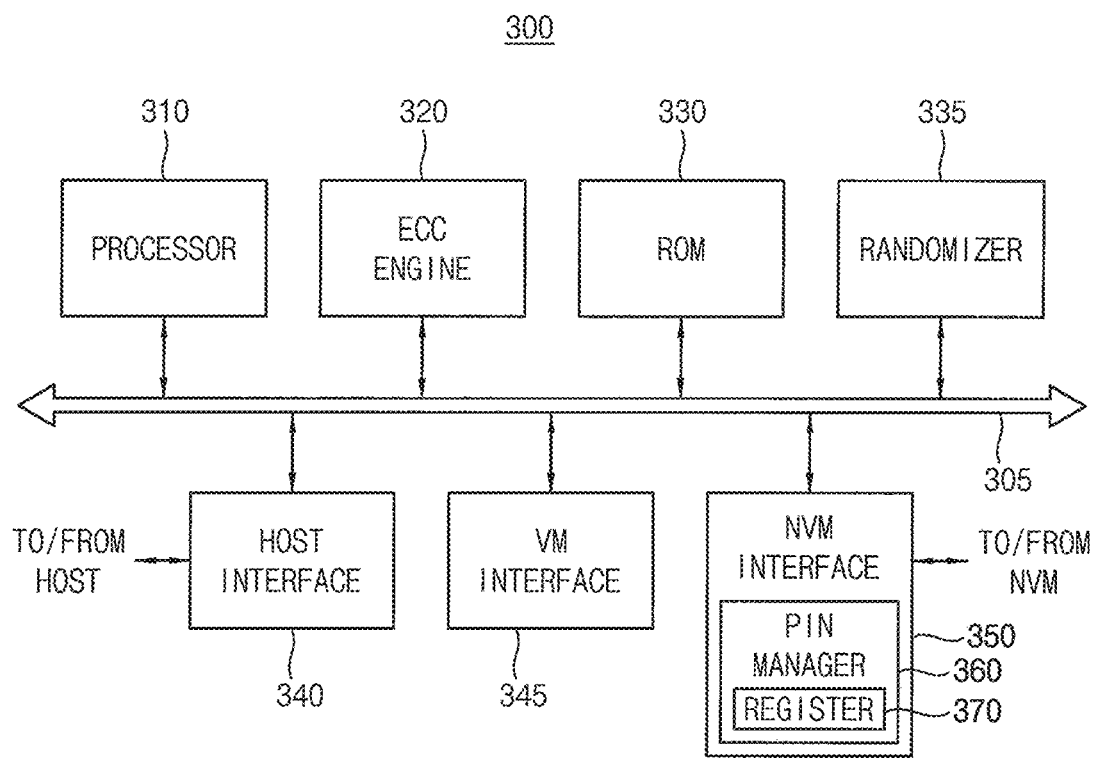
FIG. 3 is a block diagram illustrating an example of the storage controller of the storage system of FIG. 1 according to at least some example embodiments of the inventive concepts.

FIG. 3 is a block diagram illustrating an example of the storage controller of the storage system of FIG. 1 according to at least some example embodiments of the inventive concepts.

Referring to FIG. 3, the storage controller 300 may include a storage controller processor 310, an error correction code (ECC) engine 320, a ROM 330, a randomizer 335, a host interface 340, a volatile memory (VM) interface 345 and a nonvolatile memory (NVM) interface 350 which are connected via a bus 305. The nonvolatile memory interface 350 may include a pin manager 360 and the pin manager 360 may include a register 370. According to at least some example embodiments of the inventive concepts, the storage controller processor 310 may be or include hardware including logic circuits; a hardware/software combination executing software; or a combination thereof. For example, the storage controller processor 310 more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc. The storage controller processor 310 may be configured, via hardware and/or software (e.g., firmware), to perform and/or control any operation described in the specification as being performed by a storage controller processor, a storage controller, a storage device or an element thereof (e.g., the storage controller 300 and/or the non-volatile memory devices 400a~400k and leakage detection circuit 600 of the storage device 200, and/or the ECC engine 320, ROM 330, randomizer 335, host interface 340, VM interface 345, NVM interface 350, pin manager 360 and/or bus 305 of the storage controller 300). According to at least one example embodiment of the inventive concepts, the storage controller processor 310 is a central processing unit (CPU). Further, any or all of the ECC engine 320, randomizer 335, host interface 340, VM interface 345, NVM interface 350 and pin manager 360 of the storage controller 300 may be implemented by one or more circuits or circuitry. Accordingly, the ECC engine 320, randomizer 335, host interface 340, VM interface 345, NVM interface 350, pin manager 360 and storage controller 300 may be referred to in the present specification as the ECC engine circuit 320, randomizer circuit 335, host interface circuit 340, VM interface circuit 345, NVM interface circuit 350, pin manager circuit 360 and storage controller circuit 300, respectively.

The processor 310 controls an overall operation of the storage controller 300.

Memory cells of the nonvolatile memory devices 400a~400k may have a physical characteristic that a threshold voltage distribution varies for various reasons, such as a program elapsed time, a temperature, program disturbance, read disturbance and etc. For example, data stored at the nonvolatile memory devices 400a~400k may become erroneous for one or more of these reasons. The storage controller 300 utilizes a variety of error correction techniques to correct such errors. For example, the storage controller 300 may include the ECC engine 320. The ECC engine 320 may correct errors in data read from the nonvolatile memory devices 400a~400k.

The ROM 330 may store firmware that may be read and executed by the processor 310, and the firmware may be loaded in the volatile memory device 250 by the processor 310 and executed by the processor 310.

The randomizer 335 randomizes data to be stored in the nonvolatile memory devices 400a~400k. For example, the randomizer 335 may randomize data to be stored in the nonvolatile memory devices 400a~400k in a unit of a word-line. Data randomizing processes data such that program states of memory cells connected to a word-line have the same ratio. For example, if memory cells connected to one word-line are multi-level cells (MLC) each storing 2-bit data, each of the memory cells has one of an erase state and first through third program states.

According to at least some example embodiments of the inventive concepts, the randomizer 335 randomizes data such that, in memory cells connected to one word-line, the number of memory cells having the erase state, the number of memory cells having the first program state, the number of memory cells having the second program state, and the number of memory cells having the third program state are the same or substantially the same as one another. For example, memory cells in which randomized data is stored have program states of which the number is equal to one another.

The randomizer 335 de-randomizes data read from the nonvolatile memory devices 400a~400k.

The storage controller 300 may communicate with the host 100 through the host interface 340 and may communicate with the nonvolatile memory devices 400a~400k through the nonvolatile memory interface 350. The storage controller 300 may control the volatile memory device 250 through the volatile memory interface 345.

The pin manager 360 may sequentially apply each of a plurality of turn-on voltages to respective gate of a plurality of selection transistors connected in parallel between respective one of the connection nodes and a first node in the leakage detection circuit and may store leakage information on defective pins in which the leakage occurs in the register 370. The processor 370 may adaptively change the operation mode of the nonvolatile memory devices 400a~400k by referring to the leakage information stored in the register

370. That is, the processor 370 may adaptively change the operation mode by referring to the register 370.

FIG. 4 is a block diagram illustrating an example of an interface for the storage system of FIG. 1 according to at least some example embodiments of the inventive concepts.

In FIG. 4, a SATA interface is shown as an example. However, example embodiments are not limited thereto.

Referring to FIG. 4, the storage device 200 in the storage system 5 may include the storage controller 300, the nonvolatile memory devices 400a~400k and a leakage detection circuit 600.

The storage interface 140 and the connector 240 may be connected via a SATA cable including a data segment and a power segment.

The data segment (e.g., the signal connector 241) is shown to include two unidirectional data line pairs, DIN and DOUT. DIN is used to provide data from the host 100 to the storage device 200. DOUT is used to provide data from the storage device 200 to the host 100. The data lines implementing DIN and DOUT may be connected between respective transmission (TX) terminals and receiving (RX) terminals (e.g., TXP, TXN, RXP, and RXN terminals) of the host 100 and storage device 200. The data segment may be also referred to as a signal segment.

The power segment (e.g., the power connector 243) includes fifteen power lines (e.g., P1 to P15). The power segment may be connected to various power terminals (PWR) of the host 100 and storage device 200, and may be respectively used to provide various voltages, such as 3.3V, 5V and 12V, from the host 100 to the storage device 200.

The leakage detection circuit 600 may be connected to the connection terminals of the storage controller 300 and to the each set of pins having same attribute, may detect leakage of the each set of pins and may provide the storage controller 300 with a detection signal DS indicating a result of detecting the leakage. The leakage detection circuit 600 may sequentially or concurrently detect the leakage of the each set of pins and may provide the storage controller 300 with a detection signal DS FIG. 5A shows an upper surface of the connector in FIG. 1 according to at least some example embodiments of the inventive concepts, and FIG. 5B shows a lower surface of the connector in FIG. 1 according to at least some example embodiments of the inventive concepts.

Figure 5A:
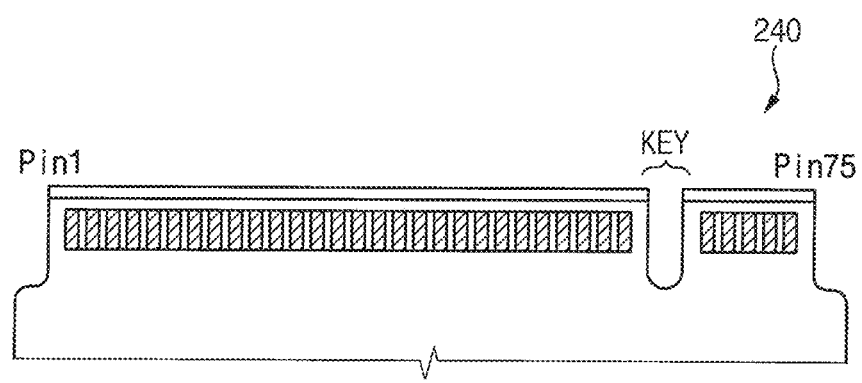
FIG. 5A shows an upper surface of the connector in FIG. 1 according to at least some example embodiments of the inventive concepts.

As shown in FIG. 5A, odd-numbered pins among first to 75th pins may be disposed in parallel on the upper surface of the connector 240. As shown in FIG. 5B, even-numbered pins among the second to 74th pins may be disposed in parallel on the lower surface of the connector 240.

The connector 240 may provide a key in which no pin is disposed. According to at least some example embodiments of the inventive concepts, the key may prevent the connector 240 from being inverted when inserted into the host 100. For example, the key may be off center of the connector 240 and may be formed at positions of the 59th to 66th pins (Pin59 to Pin66). Pins of the connector 240 may be arranged to support a communication interface such as PCIe. The arrangement of pins may be changed to support other communication interfaces.

Figure 5B:
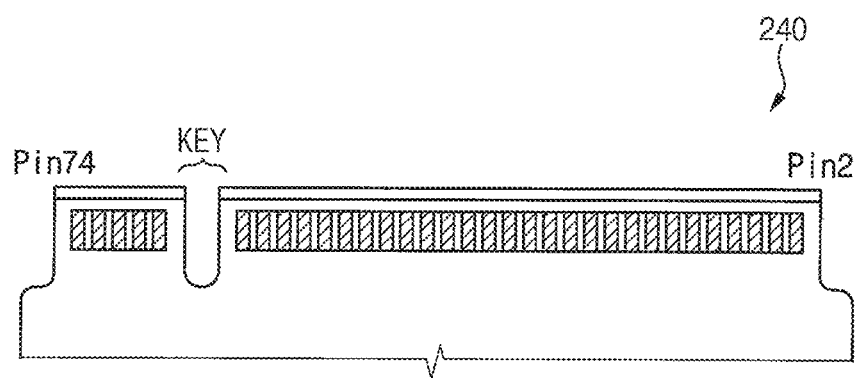
FIG. 5B shows a lower surface of the connector in FIG. 1 according to at least some example embodiments of the inventive concepts.

FIG. 6 illustrates connection terminals of the connector in FIGS. 5A and 5B according to at least some example embodiments of the inventive concepts.

Referring to FIGS. 5A and 6, first to 75th pins of the connector 240 are illustrated. For example, odd-numbered pins among first to 75th pins may be disposed on the upper surface of the connector 240, and even-numbered pins among the second to 74th pins may be disposed on the lower surface of the connector 240.

The first, third, ninth, 15th, 21st, 27th, 33rd, 39th, 45th, 51st, 57th, 71st, 73rd, and 75th pins Pin1, Pin3, Pin9, Pin15, Pin21, Pin27, Pin33, Pin39, Pin45, Pin51, Pin57, Pin71, Pin73, and/or Pin75 may be configured to be connected to a ground voltage GND without regard to communication type of the storage device 200.

The second, fourth, 14th, 16th, 18th, 70th, 72nd, and 74th pins Pin2, Pin4, Pin14, Pin16, Pin18, Pin70, Pin72, and Pin74 may not be connected (not connected (N/C)) or receive a power of 3.3 V depending on a power mode. The power mode may be determined based on the communication type of the storage device 200 or without regard to communication type of the storage device 200. N/C may denote that a pin is not connected to the storage controller 300 through physical wiring. In some example embodiments, N/C may denote that a pin is connected to the storage controller 300 through physical wiring but the storage controller 300 may not use the pin.

The 40th and 42nd pins (Pin40 and Pin42) may form a sideband interface as a part of a system management bus (SMBus). The 40th pin (Pin40) may input a clock SMB_CLK of the system management bus from the host 100 to the connector 240 or may output the clock SMB_CLK from the connector 240 to the host device 100. The 40th pin (Pin40) may switch between 0 V and 1.8 V.

The 42nd pin (Pin42) may input data SMB_DATA of the system management bus from the host 100 to the connector 240 or may output the data SMB_DATA from the connector 240 to the host 100. The 42nd pin (Pin42) may switch between 0 V and 1.8 V.

The 56th and 58th pins (Pin56 and Pin58) may be used during a manufacture process of the storage device 200. The 56th pin Pin56 may be reserved for manufacturing data transfer (MFG_DATA) during manufacturing.

The 58th pin Pin58 may be reserved for manufacturing clock transfer (MFG_CLK) during manufacturing. The 56th and 58th pins (Pin56 and Pin58) may not be used after manufacturing of the storage device 200 is finished, e.g., during normal operation of the storage device 200. The 68th pin (Pin68) may be used for receiving a suspend clock SUSCLK in a low-power mode. For example, the suspend clock SUSCLK may have a frequency of 32 kHz.

The 59th to 66th pins (Pin59 to Pin66) correspond to the key shown in FIG. 2 and may not be provided in practice. However, the 59th to 66th pins (Pin59 to Pin66) are shown in FIG. 6 to clearly describe pin numbers.

The fifth pin (Pin5) may be used as a third negative transmission terminal PETn3 in a PCIe communication interface. The seventh pin (Pin7) may be used as a third positive transmission terminal PETp3 in the PCIe communication interface. The 11th pin (Pin11) may be used as a third negative reception terminal PERn3 in the PCIe communication interface.

The 13th pin (Pin13) may be used as a third positive reception terminal PERp3 in the PCIe communication interface.

The 17th pin (Pin17) may be used as a second negative transmission terminal PETn2 in the PCIe communication interface. The 19th pin (Pin19) may be used as a second positive transmission terminal PETp2 in the PCIe communication interface. The 23rd pin (Pin23) may be used as a second negative reception terminal PERn2 in the PCIe communication interface.

The 25th pin (Pin25) may be used as a second positive reception terminal PERp2 in the PCIe communication interface.

The 29th pin (Pin29) may be used as a first negative transmission terminal PETn1 in the PCIe communication interface. The 31st pin (Pin31) may be used as a first positive transmission terminal PETp1 in the PCIe communication interface. The 35th pin (Pin35) may be used as a first negative reception terminal PERn1 in the PCIe communication interface. The 37th pin (Pin37) may be used as a first positive reception terminal PERp1 in the PCIe communication interface.

The 41st pin (Pin41) may be used as a zeroth negative transmission terminal PETn0 in the PCIe communication interface. The 43rd pin (Pin43) may be used as a zeroth positive transmission terminal PETp0 in the PCIe communication interface.

The 47th pin (Pin47) may be used as a zeroth negative reception terminal PERn0 in the PCIe communication interface. The 49th pin (Pin49) may be used as a zeroth positive reception terminal PERp0 in the PCIe communication interface.

The 53rd pin (Pin53) may be used for receiving a negative reference clock REFCLKn in the PCIe communication interface. The 55th pin (Pin55) may be used for receiving a positive reference clock REFCLKp in the PCIe communication interface.

The 10th pin (Pin10) may be used by the storage device 200 to transmit a signal LED1 # for controlling an external light-emitting diode (LED) to the outside (e.g., the host device 100).

The 38th connection terminal 38 may be used to transmit or receive a device sleep signal DEVSLP or a power disable signal PWDIS in the SATA communication type and may be not connected N/C in the PCIe communication type. The 44th connection terminal 44 may be not connected N/C in the SATA communication type and may be used to receive or transmit an alert signal ALERT # in the PCIe communication type. The 44th connection terminal 44 may be included in the system management bus SMBus in the PCIe communication type.

The 50th connection terminal 50 may be not connected N/C in the SATA communication type and may be used to receive a reset signal PERST #0 in the PCIe communication type. The 52nd connection terminal 52 may be not connected N/C in the SATA communication type and may be used to transmit or receive a clock request signal CLKREQ # in the PCIe communication type. The 54th connection terminal 54 may be not connected N/C in the SATA communication type and may be used to transmit or receive a wakeup signal PEWAKE # in the PCIe communication type.

The 69th connection terminal 69 may be used to notify the external host device of information about the communication type of the storage device 200. The 69th connection terminal 69 may be connected to a ground node of the storage device 200 in the SATA communication type and may provide a ground voltage to the host device as a notification signal PEDET. The 69th connection terminal 69, in the PCIe communication type, may be not connected N/C or may be floated. That is, the 69th connection terminal 69 may be used for the storage device 200 to support the multiple communication protocols, in detail, to determine whether to use any one of the multiple communication protocols.

The 6th, 8th, 20th, 22nd, 24th, 26th, 28th, 30th, 32nd, 34th, 36th, 46th, 48th, and 67th connection terminals 6, 8, 20, 22, 24, 26, 28, 30, 32, 34, 36, 46, 48, and 67 may be used to support power modes.

The description on the connection terminals are just for examples, and a number and a function of each of the connection terminals may vary based on communication protocols.

Figures 7, 8:
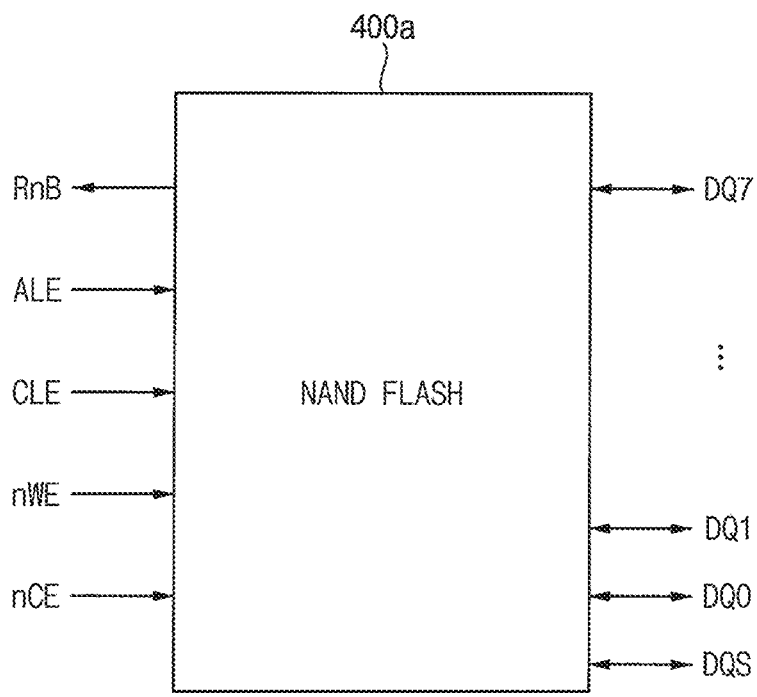
FIG. 7 illustrates an external configuration of one of the nonvolatile memory devices in the storage device in FIG. 4
FIG. 8 is a table providing descriptions of pins of the nonvolatile memory device of FIG. 7.

FIG. 7 illustrates an external configuration of one of the nonvolatile memory devices in the storage device in FIG. 4 and FIG. 8 is a table providing descriptions of pins of the nonvolatile memory device of FIG. 7.

Referring to FIG. 7, the nonvolatile memory device 400a may include control pins associated with control signals RnB, ALE, CLE, nWE and nCE. The nonvolatile memory device 400a may further include data pins and a data strobe pin associated with data signals DQ0 through DQ7 and data strobe signal DQS. The nonvolatile memory device 400a may transmit a read/busy signal RnB to the storage controller 300, may receive the control signals ALE, CLE, nWE and nCE from the storage controller 300 and may exchange the data signals DQ0 through DQ7 and the data strobe signal DQS with the storage controller 300.

Figure 9:
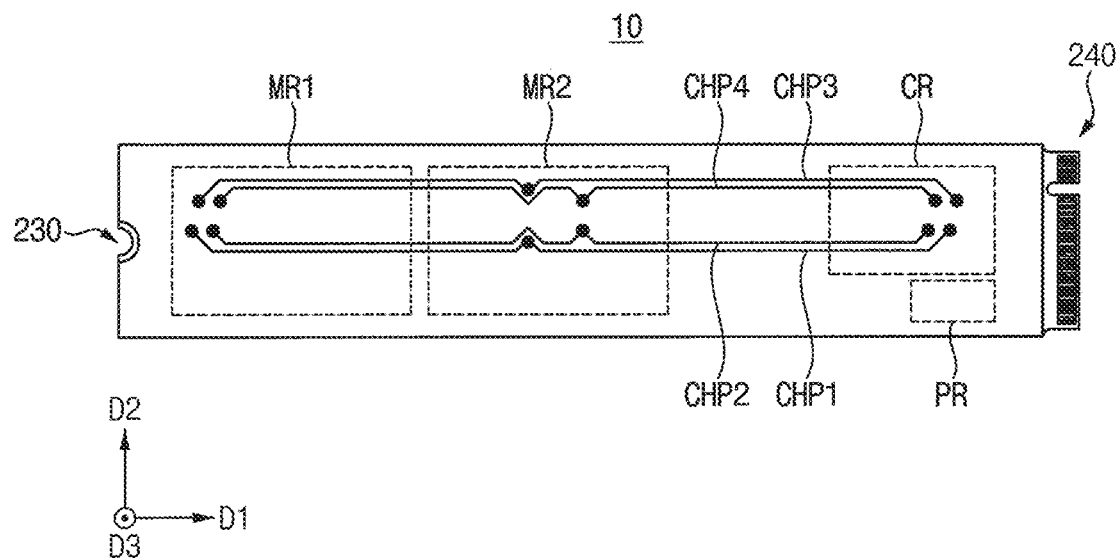
FIGS. 9 and 10 are a plan view and a cross-sectional view, respectively, illustrating a printed circuit board (PCB) on which a storage device is mounted according to at least some example embodiments of the inventive concepts.
Figure 10:
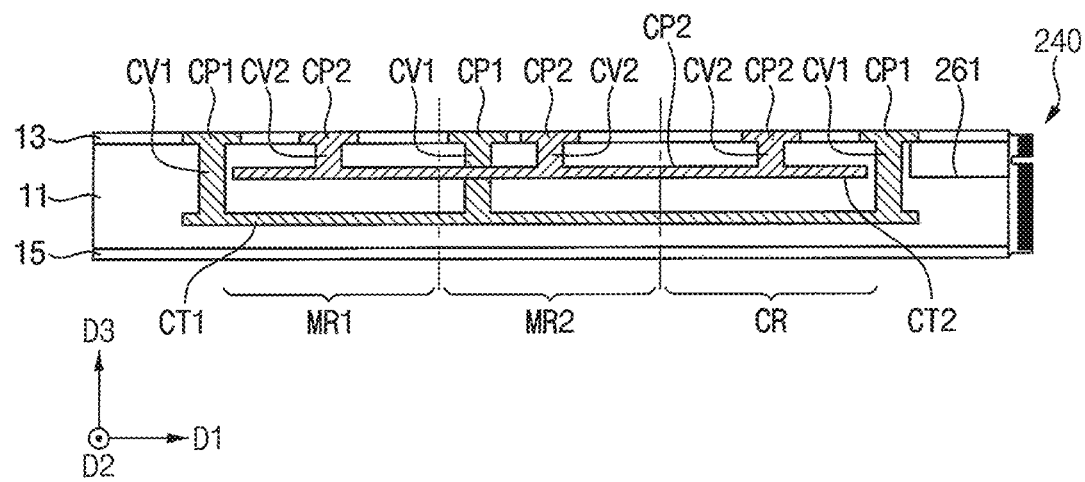

FIGS. 9 and 10 are a plan view and a cross-sectional view, respectively, illustrating a printed circuit board (PCB) on which a storage device is mounted according to at least some example embodiments of the inventive concepts.

Referring to FIGS. 9 and 10, a PCB 10 is illustrated as including a first channel pattern CHP1, a second channel pattern CHP2, a third channel pattern CHP3, and a fourth channel pattern CHP4. In addition, the PCB 10 may include the connector 240 including a plurality of connection terminals and an intended structure 230 corresponding to the connector 240.

Exposed pattern may be formed on a rim of the indented structure 230 and when mounted on the host 100, may be connected to an electric conductor of the host 100. For example, the pattern formed on the rim of the indented structure 230 may correspond to a ground node of the storage device 200 and when mounted on the host 100, may be connected to the electric conductor corresponding to the ground node of the host 100.

The PCB 10 may include a body layer 11, a top protection layer 13, and a bottom protection layer 15. The PCB 10 may include wiring units, and the wiring units on the PCB 10 may be electrically connected to the storage controller 300 and the nonvolatile memory devices 400a~400k. The PCB 10 may be electrically connected to a module substrate, a system board, a main board, etc. through the connector 240, on which the PCB is mounted.

In the body layer 11, the wiring units of a multi-layer or a single layer may be formed, and through the wiring units, the PCB 10 may be electrically connected to storage controller 300 and the nonvolatile memory devices 400a~400k. The top and bottom protection layers 13 and 15 may perform a protection function and may be formed with solder resist.

In addition, the body layer 11 may be generally implemented by pressing to a certain thickness a high polymer material such as thermosetting resin, epoxy resin or phenolic resin such as flame retardant 4 (FR-4), bismaleimide triazine (BT), and Ajinomoto build-up film (ABF), forming the pressed result into a thin layer, coating copper foil on both sides of the formed thin layer, and forming through patterning the wiring units which are transmission paths of electrical signals.

In addition, in some example embodiments, the PCB 10 may be provided as a single layer PCB forming the wirings on one side thereof and in other example embodiments as a double layer PCB forming the wirings on both sides thereof. In addition, the number of thin layers may be 3 or more and may be formed by using an insulating material such as prepreg, and a PCB including multi-layer wirings may be implemented by forming 3 or more wiring layers according to the number of formed thin layers.

The PCB 10 may be a substrate on which the semiconductor package is mounted thereon and include an insulating layer and the wiring unit. The wiring unit may include a first conductive trace CT1 and a second conductive trace CT2, which are formed in the insulating layer, and may include one or more first conductive vias CV1 passing through the insulating layer and connected to the first conductive trace CT1, and one or more second conductive vias CV2 passing through the insulating layer and connected to the second conductive trace CT2.

The first channel pattern CHP1 may be a first wiring unit and may include the first conductive trace CT1 extending in the second direction D2, the first conductive via CV1 extending in the third direction D3, and a first conductive pad CP1 formed on a top side of the first conductive via CV1.

The second channel pattern CHP2 may be a second wiring unit and may include the second conductive trace CT2 extending in the second direction D2, the second conductive via CV2 extending in the third direction D3, and a second conductive pad CP2 formed on a top side of the second conductive via CV2.

In some example embodiments, the reason why the second channel pattern CHP2 formed in a daisy chain manner/topology has different wiring lengths in a first mounting area MR1 and a second mounting area MR2 is because providing a method for compensating for signal loss in only any one of the first mounting area MR1 and the second mounting area MR2 may be desired.

In some example embodiments, a semiconductor package in the first mounting area MR1 may be electrically connected to the first through fourth channel patterns CHP1 through CHP4, and a semiconductor package in the second mounting area MR2 may be electrically connected to the second and third channel patterns CHP2 and CHP3.

Although only the first and second channel patterns CHP1 and CHP2 are illustrated in FIG. 10 for convenience of description, the first and fourth channel patterns CHP1 and CHP4 may be configured to be the same or substantially the same as each other in a point to point manner/topology (or may be configured as one channel pattern group), and the second and third channel patterns CHP2 and CHP3 may be configured to be the same or substantially the same as each other in a daisy chain manner/topology (or may be configured as another channel pattern group).

The second channel pattern CHP2 and the third channel pattern CHP3 may be formed to face each other and adjacent to each other, and the first channel pattern CHP1 and the fourth channel pattern CHP4 may be formed to face each other with the second channel pattern CHP2 and the third channel pattern CHP3 therebetween. Since the second and third channel patterns CHP2 and CHP3 are formed in a daisy chain manner/topology and have branching points in the middle thereof, the branching points may be configured in an arrangement shape as described above, so that the branching points do not overlap the first and fourth channel patterns CHP1 and CHP4, in other words, for easiness of circuit design.

In FIG. 10, the first channel pattern CHP1 is illustrated as being formed on a layer closer to the bottom protection layer 15 than the second channel pattern CHP2. However, the second channel pattern CHP2 may be formed on a layer closer to the bottom protection layer 15 than the first channel pattern CHP1, and in some example embodiments, the first channel pattern CHP1 and the second channel pattern CHP2 may also be formed on the same layer.

The storage controller area CR and the first mounting area MR1 may include all of the first and second conductive vias CV1 and CV2 and the first and second conductive pads CP1 and CP2, which are included in the first through fourth channel patterns CHP1 through CHP4, and the second mounting area MR2 may include only a portion of the first and second conductive vias CV1 and CV2 and the first and second conductive pads CP1 and CP2 which are included in the second and third channel patterns CHP2 and CHP3.

In addition, the PCB 10 may include a power supply area PR next to the storage controller area CR. The storage controller area CR and the connector 240 may be connected through a conductive pattern 261.

Figure 11:
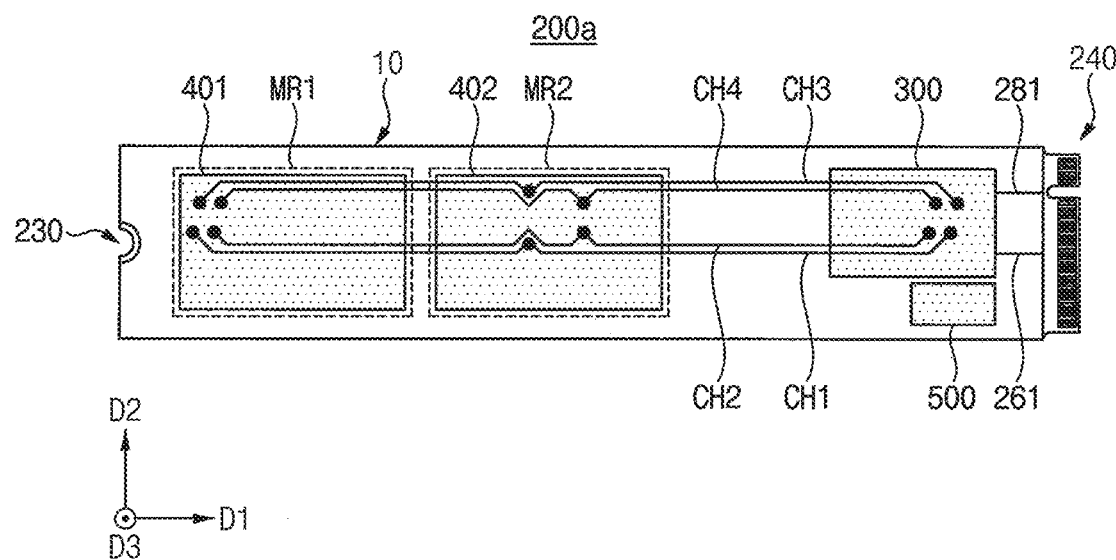
FIGS. 11 and 12 are a plan view and a cross-sectional view, respectively, illustrating a storage device according to at least some example embodiments of the inventive concepts.
Figure 12:
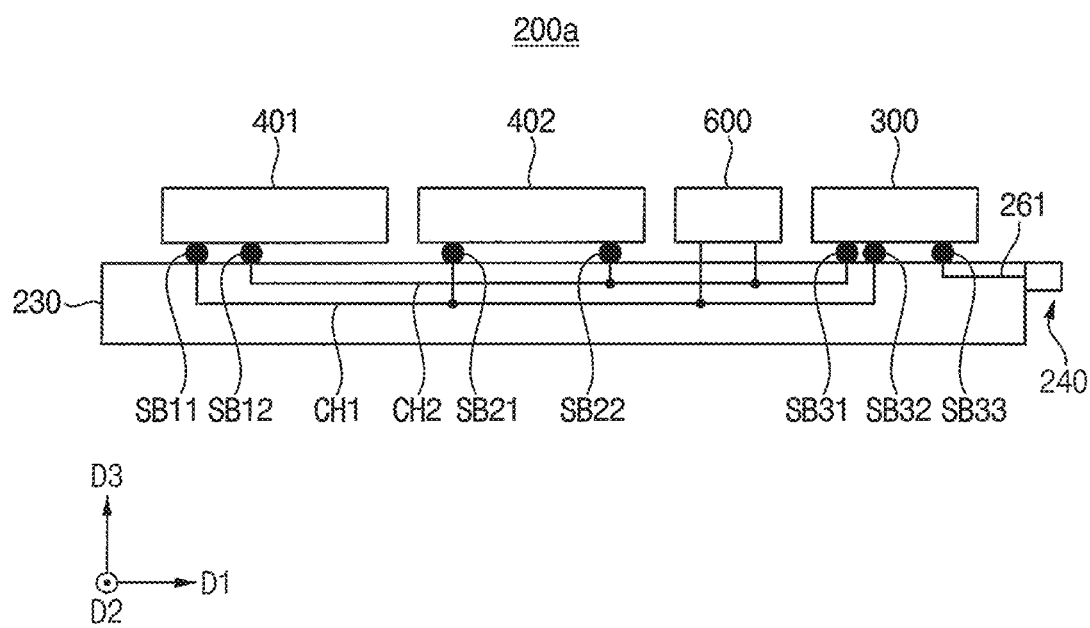

FIGS. 11 and 12 are a plan view and a cross-sectional view, respectively, illustrating a storage device according to at least some example embodiments of the inventive concepts.

Referring to FIGS. 11 and 12, there is provide a storage device 200a in which a first memory package 401 may be mounted only in the first mounting area MR1 of the PCB 10, a second memory package 402 may be mounted only in the second mounting area MR2 of the PCB 10, the first and fourth channels CH1 and CH4 are connected to the first memory package 401 and the second and third channels CH2 and CH3 are connected to the second memory package 402.

Each of the first memory package 401 and the second memory package 402 may be formed by stacking at least some of the nonvolatile memory devices 400a~400k of the storage system of FIG. 1. The first memory package 401 may be connected to the first and second channels CH1 and CH2 through solder balls SB11 and SB12, the second memory package 402 may be connected to the second channel CH2 through solder balls SB21 and SB22, the storage controller 300 may be connected to the first and second channels CH1 and CH2 through solder balls SB31 and SB32 and the leakage detection circuit 600 may be connected to the first and second channels CH1 and CH2. The solder balls SB31 and SB32 may be referred to as connection terminals. The leakage detection circuit 600 may be connected to the connection terminals of the storage controller 300 and to each set of pins having same attribute and corresponding to respective one of the connection terminals.

Conductive patterns 261 and 281 connecting the connector 240 and the storage controller 300 may be provided in the PCB 10. The conductive pattern 261 may be connected to the storage controller 300 through a solder ball SB33.

Figure 13A:
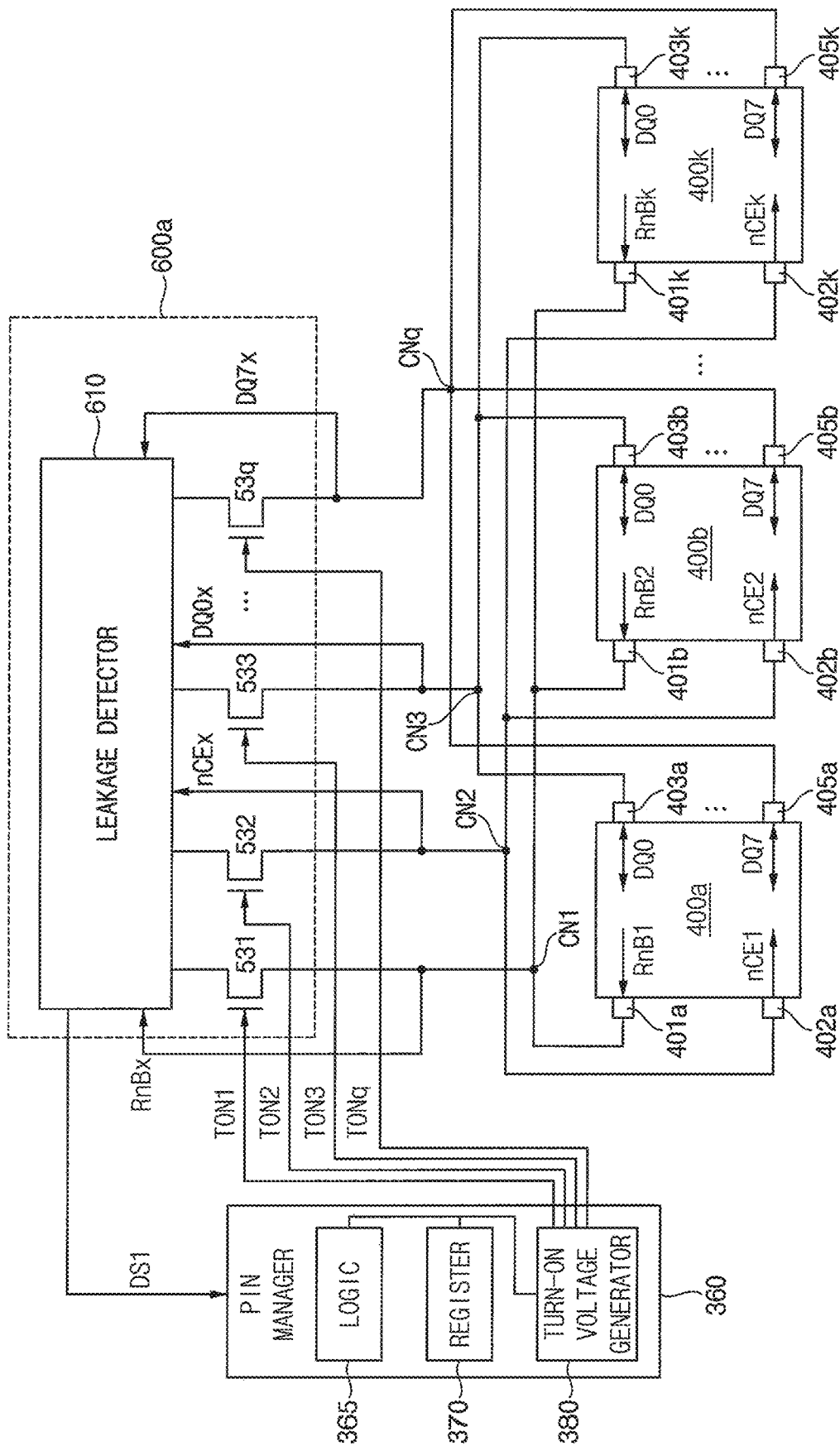
FIG. 13A illustrates a portion of the storage device of FIG. 4 according to at least some example embodiments of the inventive concepts.

FIG. 13A illustrates a portion of the storage device of FIG. 4 according to at least some example embodiments of the inventive concepts.

In FIG. 13A, the pin manager 360 in the storage controller 300, the plurality of nonvolatile memory devices 400a~400k and a leakage detection circuit 600a are illustrated.

Referring to FIG. 13A, the leakage detection circuit 600a may include a leakage detector 610 and a plurality of selection transistors 531, 532, 533, . . . , 53q. Here, q is an integer equal to or greater than four.

Each of the plurality of selection transistors 531, 532, 533, . . . , 53q may be connected to each set of pins having same attribute among a plurality of pins of the plurality of nonvolatile memory devices 400a~400k at respective one of a plurality of connection nodes CN1, CN2, CN3, . . . , CNq. Each of the plurality of selection transistors 531, 532, 533, . . . , 53q may be may be sequentially turned on in response to respective one of a plurality of turn-on voltages TON1, TON2, TON3, . . . , TONq provided from a turn-on voltage generator 380 in the pin manager 360, and may sequentially connect respective one of the plurality of connection nodes CN1, CN2, CN3, . . . , CNq to the leakage detector 610.

The nonvolatile memory device 400a may include a pin 401a outputting a ready/busy signal RnB1, a pin 402a receiving a chip enable signal nCE1, and pins 403a~405a transmitting/receiving data signals DQ0~DQ7. The nonvolatile memory device 400b may include a pin 401b outputting a ready/busy signal RnB2, a pin 402b receiving a chip enable signal nCE2, and pins 403b~405b transmitting/receiving data signals DQ0~DQ7. The nonvolatile memory device 400k may include a pin 401k outputting a ready/busy signal RnBk, a pin 402k receiving a chip enable signal nCEk, and pins 403k~405k transmitting/receiving data signals DQ0~DQ7.

The pins 401a, 401b, . . . , 401k associated with the ready/busy signals RnB1, RnB2, . . . , RnBk have same attribute and are commonly connected to a first connection node CN1. The pins 402a, 402b, . . . , 402k associated with the chip enable signals nCE1, nCE2, . . . , nCEk have same attribute and are commonly connected to a second connection node CN2. The pins 403a, 403b, . . . , 403k associated with the data signal DQ0 have same attribute and are commonly connected to a third connection node CN3. The pins 405a, 405b, . . . , 405k associated with the data signal DQ7 have same attribute and are commonly connected to a q-th connection node CNq.

The ready/busy signals RnB1, RnB2, . . . , RnBk are merged into a first merged signal RnBx at the first connection node CN1 and the first merged signal RnBx is provided to the leakage detector 610. The chip enable signals nCE1, nCE2, . . . , nCEk are merged into a second merged signal nCEx at the second connection node CN2 and the second merged signal nCEx is provided to the leakage detector 610. The data signals DQ0 are merged into a merged signal DQ0x at the third connection node CN3 and the merged signal DQ0x is provided to the leakage detector 610. The data signals DQ7 are merged into a merged signal DQ7x at the q-th connection node CNq and the merged signal DQ7x is provided to the leakage detector 610.

The pin manager 360 may include a logic 365, a register 370 and the turn-on voltage generator 380.

The logic 365 may control the turn-on voltage generator 380 to sequentially apply respective one of the turn-on voltages TON1, TON2, TON3, . . . , TONq to respective gate of the selection transistors 531, 532, 533, . . . , 53q and may store leakage information associated with each set of pins in the register 370 in response to a detection signal DS1 from the leakage detector 610. The processor 310 in FIG. 3 may change operation mode of the nonvolatile memory devices 400a~400k based on the leakage information stored in the register 370 and whether operation modes associated with defective pins at which the leakage occurs among the plurality of pins are replaceable.

Figure 13B:
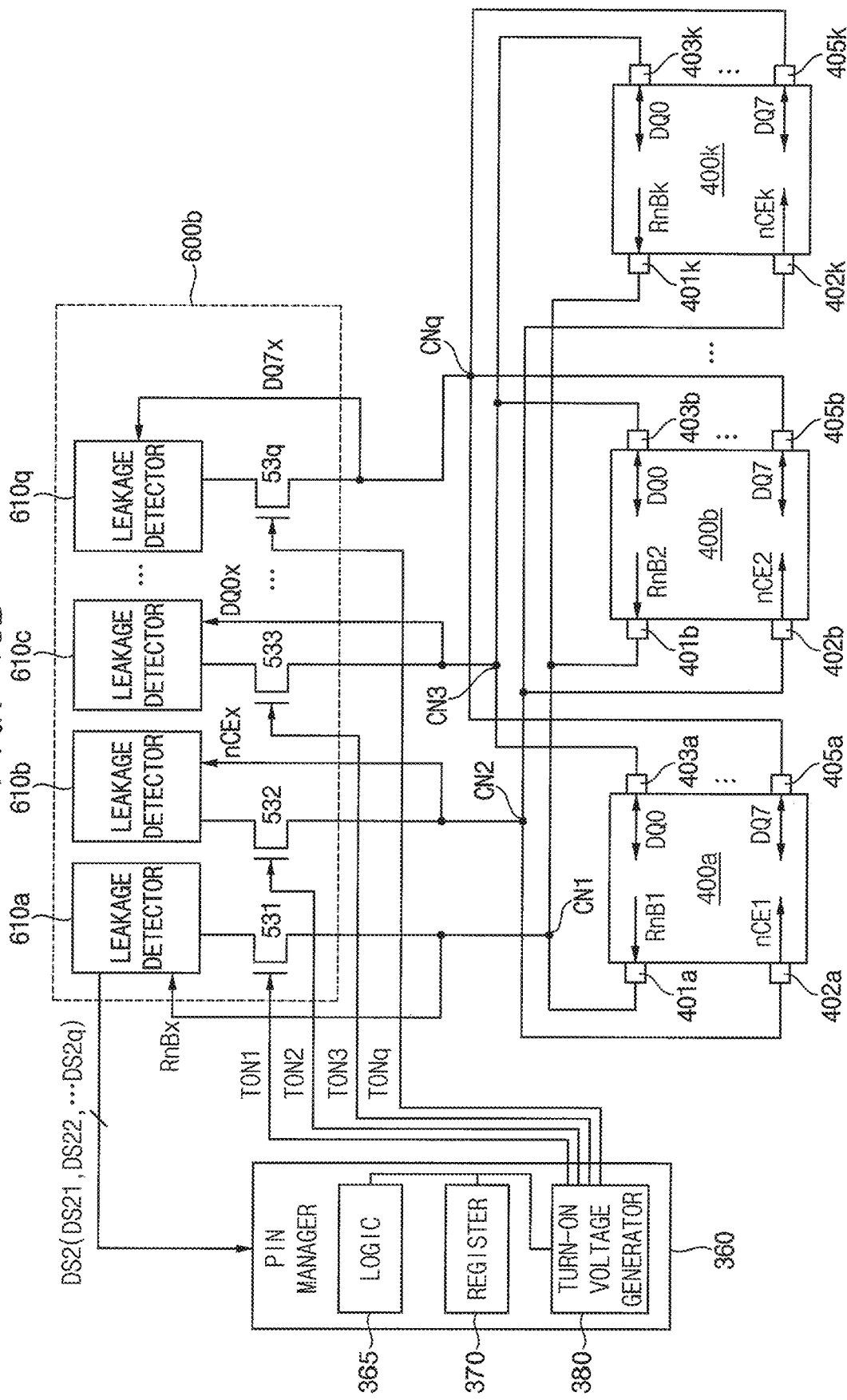
FIG. 13B illustrates a portion of the storage device of FIG. 4 according to at least some example embodiments of the inventive concepts.

FIG. 13B illustrates a portion of the storage device of FIG. 4 according to at least some example embodiments of the inventive concepts.

In FIG. 13B, the pin manager 360 in the storage controller 300, the plurality of nonvolatile memory devices 400a~400k and a leakage detection circuit 600b are illustrated.

Referring to FIG. 13b, the leakage detection circuit 600b may include a plurality of leakage detectors 610a, 610b, 610c, . . . , 610q and a plurality of selection transistors 531, 532, 533, . . . , 53q.

Each of the plurality of selection transistors 531, 532, 533, . . . , 53q may be connected to each set of pins having same attribute among a plurality of pins of the plurality of nonvolatile memory devices 400a~400k at respective one of a plurality of connection nodes CN1, CN2, CN3, . . . , CNq. Each of the plurality of selection transistors 531, 532, 533, . . . , 53q may be may be sequentially turned on in response to respective one of a plurality of turn-on voltages TON1, TON2, TON3, . . . , TONq provided from a turn-on voltage generator 380 in the pin manager 360, and may sequentially connect respective one of the plurality of connection nodes CN1, CN2, CN3, . . . , CNq to respective one of the leakage detectors 610a, 610b, 610c, . . . , 610q.

The nonvolatile memory device 400a may include a pin 401a outputting a ready/busy signal RnB1, a pin 402a receiving a chip enable signal nCE1, and pins 403a~405a transmitting/receiving data signals DQ0~DQ7. The nonvolatile memory device 400b may include a pin 401b outputting a ready/busy signal RnB2, a pin 402b receiving a chip enable signal nCE2, and pins 403b~405b transmitting/receiving data signals DQ0~DQ7. The nonvolatile memory device 400k may include a pin 401k outputting a ready/busy signal RnBk, a pin 402k receiving a chip enable signal nCEk, and pins 403k~405k transmitting/receiving data signals DQ0~DQ7.

The pins 401a, 401b, . . . , 401k associated with the ready/busy signals RnB1, RnB2, . . . , RnBk have same attribute and are commonly connected to a first connection node CN1. The pins 402a, 402b, . . . , 402k associated with the chip enable signals nCE1, nCE2, . . . , nCEk have same attribute and are commonly connected to a second connection node CN2. The pins 403a, 403b, . . . , 403k associated with the data signal DQ0 have same attribute and are commonly connected to a third connection node CN3. The pins 405a, 405b, . . . , 405k associated with the data signal DQ7 have same attribute and are commonly connected to a q-th connection node CNq.

The ready/busy signals RnB1, RnB2, . . . , RnBk are merged into a first merged signal RnBx at the first connection node CN1 and the first merged signal RnBx is provided to the leakage detector 610a. The chip enable signals nCE1, nCE2, . . . , nCEk are merged into a second merged signal nCEx at the second connection node CN2 and the second merged signal nCEx is provided to the leakage detector 610b. The data signals DQ0 are merged into a merged signal DQ0x at the third connection node CN3 and the merged signal DQ0x is provided to the leakage detector 610c. The data signals DQ7 are merged into a merged signal DQ7x at the q-th connection node CNq and the merged signal DQ7x is provided to the leakage detector 610q.

The pin manager 360 may include the logic 365, the register 370 and the turn-on voltage generator 380.

The logic 365 may control the turn-on voltage generator 380 to concurrently apply respective one of the turn-on voltages TON1, TON2, TON3, . . . , TONq to respective gate of the selection transistors 531, 532, 533, . . . , 53q and may store leakage information associated with each set of pins in the register 370 in response to detection signal DS2 including detection signals DS21, DS22, DS23, . . . , DS2q from the leakage detectors 610a, 610b, 610c, . . . , 610q. The processor 310 in FIG. 3 may change operation mode of the nonvolatile memory devices 400a~400k based on the leakage information stored in the register 370 and whether operation modes associated with defective pins at which the leakage occurs among the plurality of pins are replaceable.

Figure 14A:
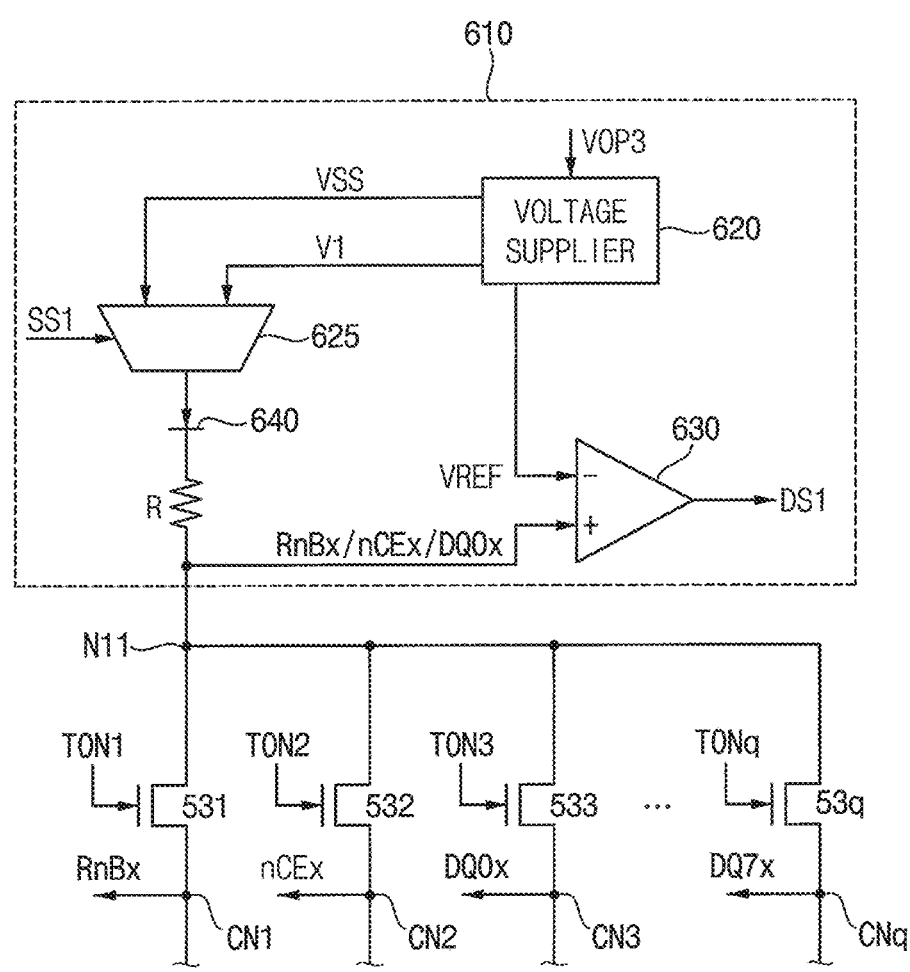
FIG. 14A is a circuit diagram illustrating an example of the leakage detector in the leakage detection circuit in FIG. 13A according to at least some example embodiments of the inventive concepts.

FIG. 14A is a circuit diagram illustrating an example of the leakage detector in the leakage detection circuit in FIG. 13A according to at least some example embodiments of the inventive concepts.

The selection transistors 531, 532, 533, . . . , 53q are also illustrated for convenience of explanation.

Referring to FIG. 14A, the leakage detector 610 may be commonly connected to the selection transistors 531, 532, 533, . . . , 53q at a first node N11 and may include a sensing resistor R, a voltage supplier 620, a multiplexer 625 and a comparator 630. According to at least some example embodiments of the inventive concepts, the voltage supplier 620 may be implemented by one or more circuits or circuitry. Accordingly, the voltage supplier 620 may be referred to in the present specification as the voltage supplier circuit 620.

The sensing resistor R may be coupled between a voltage terminal 640 and the first node N11. The voltage supplier 620 may provide a ground voltage VSS and a first voltage V1 to the multiplexer 625 and may provide a reference voltage VREF to the comparator 630 based on the operating voltage VOP3.

The multiplexer 625 may receive the ground voltage VSS and the first voltage V1, may provide the first voltage V1 to the voltage terminal 640 in a first detection mode and may provide the ground voltage VSS to the voltage terminal 640 in a second detection mode, in response to a selection signal SS1. The selection signal SS1 may be provided from the pin manager 360.

The storage controller 300 may control the leakage detection circuit 600 to perform a leakage detection in the first detection mode to detect inner leakage of each set of pins in an idle state corresponding to a stand-by state of each of the nonvolatile memory devices 400a~400k after a power is applied to the nonvolatile memory devices 400a~400k. In the idle state pins of each of the nonvolatile memory devices 400a~400k may be in one of a high level state and a low level state.

The storage controller 300 may control the leakage detection circuit 600 to perform a leakage detection in the second detection mode to detect external leakage of each set of pins in a state in which a power is not applied to the nonvolatile memory devices 400a~400k. Because the power is not applied to the nonvolatile memory devices 400a~400k in the second detection mode, all pins of the nonvolatile memory devices 400a~400k may be in a low level state assuming that the leakage does not occur.

The comparator 630 may have a negative input terminal to receive the reference voltage VREF and a positive input terminal coupled to the first node N11. The comparator 630 may compare the reference voltage VREF with respective one of the first merged signal RnBx, the second merged signal nCEx and the merged signal DQ0x sequentially and may provide the pin manager 360 with the detection signal DS1 indicating a result of comparison.

When the first selection transistor 531 is turned on in response to the turn-on voltage TON1, the first node N11 is connected to the first connection node CN1. During the first selection transistor 531 being turned on, the first node N11 is connected to the first connection node CN1 and a current flows to the first connection node CN1 through the sensing resistor R and the first selection transistor 531 when the voltage supplier 620 provides the first voltage V1 to the voltage terminal 640 via the multiplexer 625. Because the ready/busy signals RnB1, RnB2, . . . , RnBk are in high level in the idle state, the first merged signal RnBx is in high level in the idle state. When the leakage occurs at least one of the pins 401a, 401b, . . . , 401k associated with the ready/busy signals RnB1, RnB2, . . . , RnBk, the first merged signal RnBx becomes a low level. Accordingly, the comparator 630 outputs the detection signal DS1 having a low level.

When the pin manager 360 receives the detection signal DS1 having a low level, the pin manager 360 determines that the internal leakage occurs at least one of the pins 401a, 401b, . . . , 401k and store leakage information associated with the pins 401a, 401b, . . . , 401k in the register 370.

While the voltage terminal 640 is connected to the ground voltage VSS through the multiplexer 625, the first selection transistor 531 is turned on in response to the turn-on voltage TON1 and the comparator 630 output the detection signal DS1 by comparing the reference voltage VREF with the first merged signal RnBx. When an external leakage occurs between the first connection node CN1 and a connection terminal of the storage controller 300, which corresponds to the first connection node CN1, the comparator 630 may sense voltage whose level is greater than a level of the reference voltage VREF and thus, the comparator 630 outputs the detection signal DS1 having a high level.

When the pin manager 360 receives the detection signal DS1 having a low level, the pin manager 360 determines that the external leakage occurs the first connection node CN1 and the connection terminal of the storage controller 300, which corresponds to the first connection node CN1 and store leakage information associated with the pins 401a, 401b, . . . , 401k in the register 370.

During a normal operation, the storage controller 300 may determine operating status of the nonvolatile memory devices 400a~400k through the connection terminal connected to the pins 401a, 401b, . . . , 401k. When the leakage occurs at least a portion of the pins 401a, 401b, . . . , 401k, the storage controller 300 cannot determine operating status of the nonvolatile memory devices 400a~400k properly, and thus time-out may occur in the nonvolatile memory devices 400a~400k.

Similarly, the chip enable signals nCE1, nCE2, . . . , nCEk are in high level in the idle state. Therefore, when the second merged signal nCEx has a low level in the first detection mode, the pin manager 360 determines that internal leakage occurs at least one of the pins 402a, 402b, . . . , 402k. When the second merged signal nCEx has a high level in the second detection mode, the pin manager 360 determines that external leakage associated with the pins 402a, 402b, . . . , 402k occurs.

During a normal operation, the storage controller 300 applies each of the chip enable signals nCE1, nCE2, . . . , nCEk to respective one of the nonvolatile memory devices 400a-400k through a connection terminal connected to the pins 402a, 402b, . . . , 402k. When the leakage occurs at least a portion of the pins 402a, 402b, . . . , 402k, the storage controller 300 may not select a target nonvolatile memory device from the nonvolatile memory devices 400a-400k normally.

Similarly, the data signal DQ0 is in low level in the idle state. Therefore, when the merged signal DQ0x has a high level in the first detection mode, the pin manager 360 determines that internal leakage occurs at least one of the pins 403a, 403b, . . . , 403k. When the merged signal DQ0x has a low level in the second detection mode, the pin manager 360 determines that external leakage associated with the pins 403a, 403b, . . . , 403k occurs.

During the normal operation, the storage controller 300 exchanges data with the nonvolatile memory devices 400a~400k. When the leakage occurs at least a portion of the pins 403a, 403b, . . . , 403k, the storage controller 300 may not determine a logic level of the data signal DQ0 accurately.

Figure 14B:
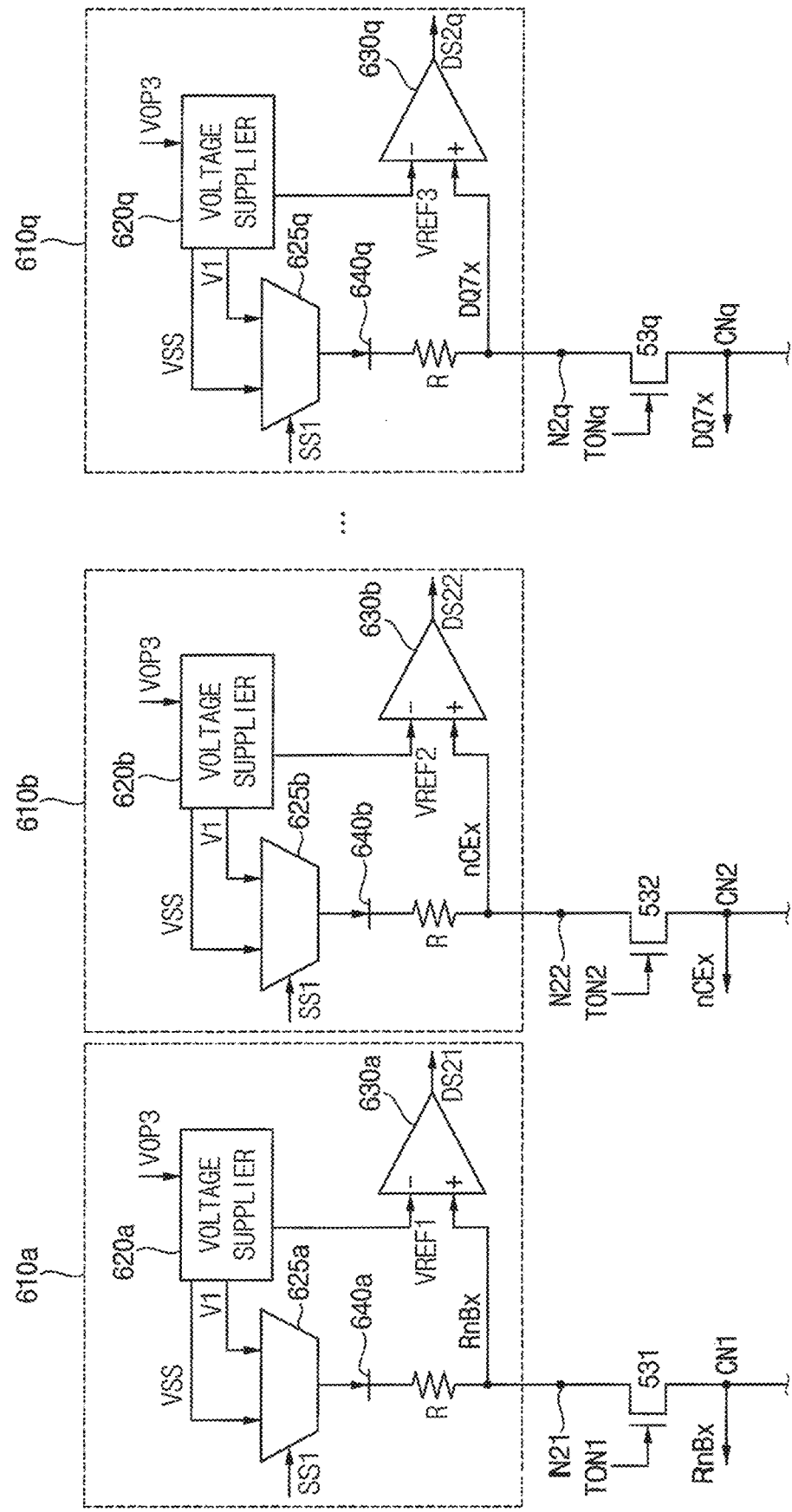
FIG. 14B is a circuit diagram illustrating an example of the leakage detectors in the leakage detection circuit in FIG. 13B according to at least some example embodiments of the inventive concepts.

FIG. 14B is a circuit diagram illustrating an example of the leakage detectors in the leakage detection circuit in FIG. 13B according to at least some example embodiments of the inventive concepts.

The selection transistors 531, 532, 533, . . . , 53q are also illustrated for convenience of explanation.

Referring to FIG. 14B, the leakage detection circuit 600b may include a plurality of leakage detectors 610a, 610b, . . . , 610q.

The leakage detector 610a may be connected to the first selection transistor 531 at a first node N21 and may include a sensing resistor R, a voltage supplier 620a, a multiplexer 625a and a comparator 630a. Configuration and operation of the leakage detector 610a may be substantially similar with configuration and operation of the leakage detector 610 in FIG. 14A. The voltage supplier 620a may provide a first reference voltage VREF1 to the comparator 630a and the comparator 630a may compare the first reference voltage VREF1 with the first merged signal RnBx and may output the detection signal DS21 indicating a result of comparison.

The leakage detector 610b may be connected to the second selection transistor 532 at a second node N22 and may include a sensing resistor R, a voltage supplier 620b, a multiplexer 625b and a comparator 630b. Configuration and operation of the leakage detector 610b may be substantially similar with configuration and operation of the leakage detector 610 in FIG. 14A. The voltage supplier 620b may provide a second reference voltage VREF2 to the comparator 630b and the comparator 630b may compare the second reference voltage VREF2 with the second merged signal nCEx and may output the detection signal DS22 indicating a result of comparison.

The leakage detector 610q may be connected to the selection transistor 53q at a q-th node N2q and may include a sensing resistor R, a voltage supplier 620q, a multiplexer 625q and a comparator 630q. Configuration and operation of the leakage detector 610q may be substantially similar with configuration and operation of the leakage detector 610 in FIG. 14A. The voltage supplier 620q may provide a third reference voltage VREF3 to the comparator 630q and the comparator 630q may compare the third reference voltage VREF3 with the merged signal DQ7x and may output the detection signal DS2q indicating a result of comparison.

The leakage detectors 610a, 610b, . . . , 610q may provide the detection signals DS21, DS22, DS23, . . . , DS2q to the pin manager 360 concurrently.

Each of the first through third reference voltages VREF1, VREF2 and VREF3 may have a corresponding level based on a set of pins on which leakage detection is performed. For example, the first reference voltage VREF1 associated with the ready/busy signal RnB having a high level in the idle state may be about 1.0 [V]. The third reference voltage VREF3 associated with the data signal DQ7 having a low level in the idle state may be about 0.2 [V].

FIG. 15 illustrates an example of the register in FIG. 13A or 13B according to at least some example embodiments of the inventive concepts.

In FIG. 15, it is assumed that the storage device 200 in FIG. 1 includes four nonvolatile memory devices and each of four nonvolatile memory devices inputs/outputs data signals DQ0~DQ7.

Referring to FIG. 15, the register 370 may store logic levels STATE of a plurality of pins, information P/F on whether leakage occurs at each of the plurality of pins, information on whether defective pins are replaceable and operation mode OP_MODE of each of four nonvolatile memory devices in idle state.

The plurality of pins of each of four nonvolatile memory devices may include respective one of pins CE0P~CE3P to receive respective one of chip enable signals nCE0~nCE3, a pin CLEP to receive a command latch enable signal CLE, a pin ALEP to receive an address latch enable signal ALE, a pin WEBP to receive a write enable signal nWE, pins REBP and REP to receive read enable signals nRE and nREB, pins DQSP and DQSBP to receive data strobe signals DQS and DQSB, a pin to output a ready/busy signal RnB, and pins DQ0P~DQ7P to input/output data signals DQ0~DQ7.

Logic level of each of the plurality of pins in idle state may be represented as 'H' corresponding to a high level or as 'L' corresponding to a high level. The information on whether the leakage occurs may be represented as 'P' corresponding to a high level or as 'L' corresponding to a high level. The information on whether leakage occurs at each of the plurality of pins may be represented as 'F' indicating that the leakage occurs or as 'P' indicating that the leakage does not occur. The information on whether the defective pins are replaceable may be represented as 'X' indicating that replacement is not possible or as 'O' indicating that replacement is possible. The operation mode OP_MODE may designate a specific mode.

For example, when the leakage (including internal leakage and external leakage) occurs (or is detected) at each of the pins CE0P~CE3P to receive respective one of chip enable signals nCE0~nCE3, the pin CLEP to receive the command latch enable signal CLE, the pin ALEP to receive the address latch enable signal ALE and the pin WEBP to receive the write enable signal nWE, the pins are not replaceable as represented by 'X'.

For example, when the leakage occurs at one of the pins REBP and REP to receive the read enable signals nRE and nREB corresponding to differential signal, the processor 310 may change signal reception mode of the pins REBP and REP from a differential mode to use both of the read enable signals nRE and nREB to a CMOS mode to use one of the read enable signals nRE and nREB. For example, when the leakage occurs at one of the pins DQSP and DQSBP to receive the data strobe signals DQS and DQSB corresponding to differential signal, the processor 310 may change signal reception mode of the pins DQSP and DQSBP from a differential mode to use both of the data strobe signals DQS and DQSB to a CMOS mode to use one of the data strobe signals DQS and DQSB.

For example, when the leakage occurs at one of the pins DQ0P~DQ7P to input/output data signals DQ0~DQ7, the processor 310 may change data input/output mode from a first data input/output mode X8 to a second data input/output mode X4. When the leakage occurs at the pin DQ0P, the processor 310 may change data input/output mode from the first data input/output mode X8 to use all of the data signals DQ0~DQ7 to the second data input/output mode X4 to use the data signals DQ4~DQ7. When the leakage occurs at the pin DQ6P, the processor 310 may change data input/output mode from the first data input/output mode X8 to use all of the data signals DQ0~DQ7 to the second data input/output mode X4 to use the data signals DQ0~DQ3.

For example, when the leakage occurs at the pin RnBP associated with the ready/busy signal RnB, the processor 310 may change internal operation status check of each of the nonvolatile memory devices from a first mode based on a level of the ready/busy signal RnB to a second mode based on a command. The level of the ready/busy signal RnB may be referred to as 'polling'.

Figure 16:
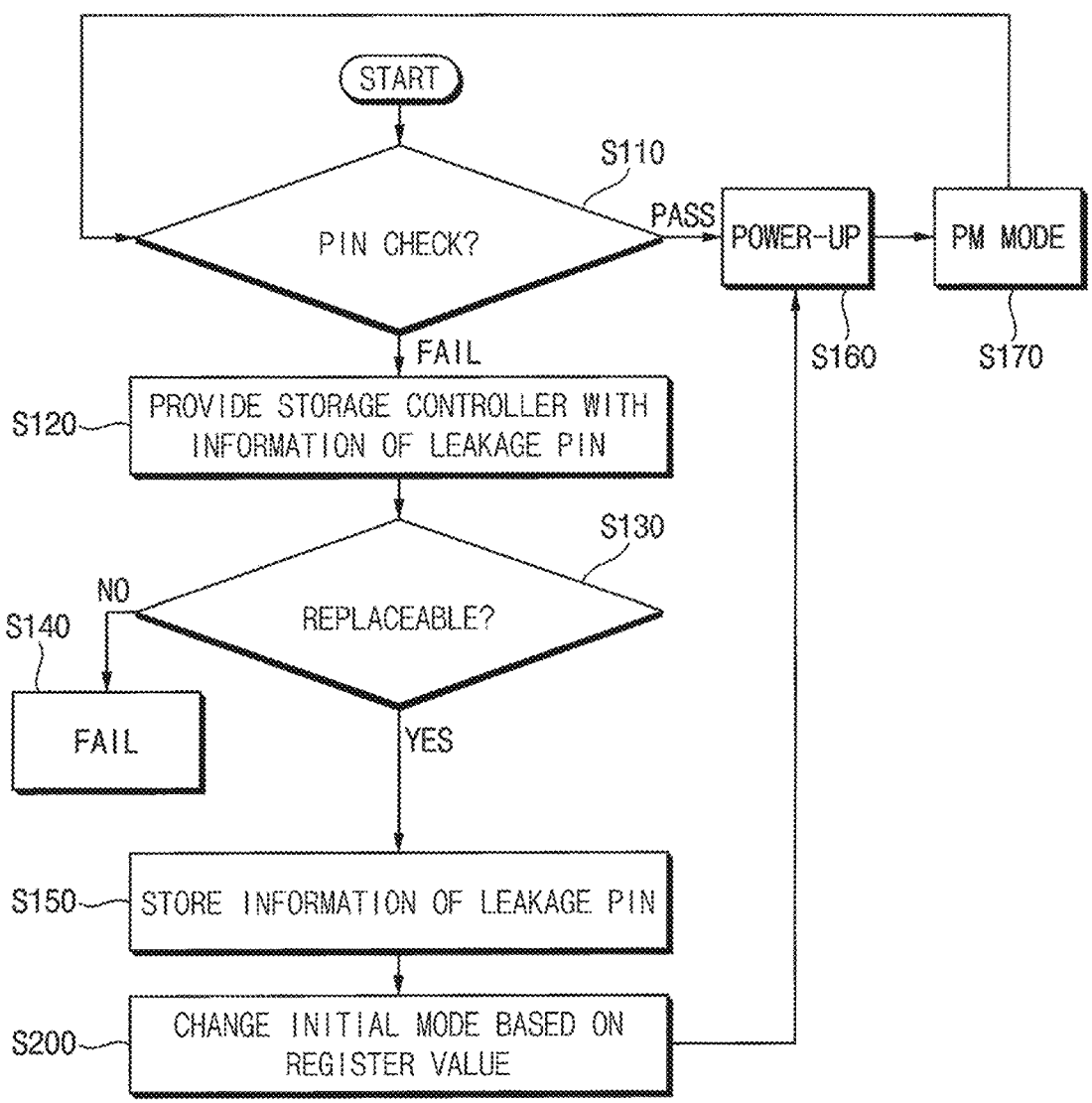
FIG. 16 is a flow chart illustrating a method of operating a storage device according to at least some example embodiments of the inventive concepts.

FIG. 16 is a flow chart illustrating a method of operating a storage device according to at least some example embodiments of the inventive concepts.

Referring to FIGS. 4 through 16, the leakage detection circuit 600 checks (determines) whether leakage occurs at pins having same attribute, of the nonvolatile memory devices 400a~400k (operation S110). When the leakage occurs (FAIL in operation S110), the leakage detection circuit 600 provides the storage controller 300 with leakage information associated with leakage pins at which the leakage occurs (operation S120).

The storage controller 300 determines whether operation modes associated with the defective pins are replaceable (operation S130). When the operation modes associated with the defective pins are not replaceable (NO in operation S130), the processor 310 determines the leakage pins as 'fail' (operation S140).

When the operation modes associated with the defective pins are replaceable (YES in operation S130), the processor 310 stores the leakage information of the leakage pins in the register 370 in the pin manager 360 (operation S150). The processor 310 changes initial mode (or, operation mode) of the nonvolatile memory devices 400a~400k based on the leakage information stored in the register 370 (operation S200). The leakage information stored in the register 370 may be referred to as 'register value'.

The processor 310 performs a power-up sequence (operation S160) after changing the initial mode. When the power-up sequence is completed, the processor 310 sets power management (PM) mode of the nonvolatile memory devices 400a~400k (operation S170) and operates the nonvolatile memory devices 400a~400k. The processor 310 may periodically perform leakage detection on the pins having same attribute, of the nonvolatile memory devices 400a~400k in idle state during a normal operation. When the leakage does not occur (PASS in operation S110), the processor 310 performs a power-up sequence (operation S160).

Figure 17:
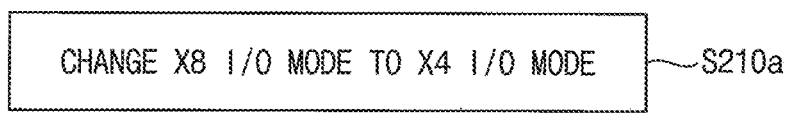
FIG. 17 illustrates an example of changing operation mode in FIG. 16 according to at least some example embodiments of the inventive concepts.

FIG. 17 illustrates an example of changing operation mode in FIG. 16 according to at least some example embodiments of the inventive concepts.

Referring to FIG. 17, when the leakage occurs at the pin DQ6P associated with the data signal DQ6 and the pin DQ6P are not usable, for changing operation mode (operation S200a), the processor 310 may change data input/output mode from a first data input/output mode X8 to use all of the data signals DQ0~DQ7 to a second data input/output mode X4 to use the data signals DQ0~DQ3 (operation S210a).

Figure 18:
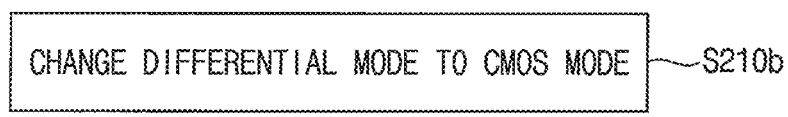
FIG. 18 illustrates another example of changing operation mode in FIG. 16 according to at least some example embodiments of the inventive concepts.

FIG. 18 illustrates another example of changing operation mode in FIG. 16 according to at least some example embodiments of the inventive concepts.

Referring to FIG. 18, when the leakage occurs at one of the pins REBP and REP to receive the read enable signals nRE and nREB corresponding to differential signal and the leakage pin is not usable, for changing operation mode (operation S200b), the processor 310 may change signal reception mode of the pins REBP and REP from a differential mode to use both of the read enable signals nRE and nREB to a CMOS mode to use one of the read enable signals nRE and nREB (operation S210b). The CMOS mode may be referred to as a single ended signal mode. The mode change associated with differential signal may be applicable to the data strobe signals DQS and DQSB.

Figure 19:
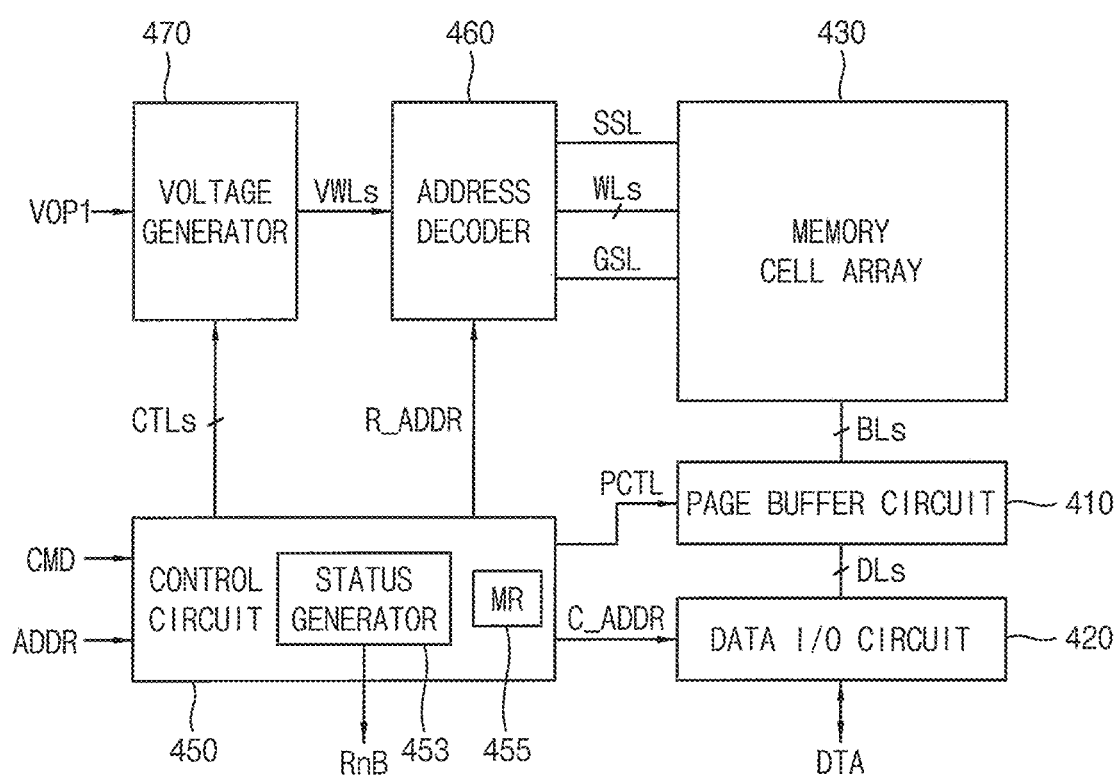
FIG. 19 is a block diagram illustrating one of the nonvolatile memory devices in the storage device of the storage system of FIG. 1 according to at least some example embodiments of the inventive concepts.

FIG. 19 is a block diagram illustrating one of the nonvolatile memory devices in the storage device of the storage system of FIG. 1 according to at least some example embodiments of the inventive concepts.

Referring to FIG. 19, the nonvolatile memory device 400a includes a memory cell array 430, an address decoder 460, a page buffer circuit 410, a data input/output circuit 420, a control circuit 450, and a voltage generator 470. The control circuit 450 may include a status generator 453 that outputs the ready/busy signal RnB and a mode register (MR) 455 to set operation mode of the nonvolatile memory device 400a.

The memory cell array 430 is coupled to the address decoder 460 through a string selection line SSL, a plurality of word-lines WLs, and a ground selection line GSL. In addition, the memory cell array 430 is coupled to the page buffer circuit 410 through a plurality of bit-lines BLs. The memory cell array 430 includes a plurality of memory cells coupled to the plurality of word-lines WLs and the plurality of bit-lines BLs. The memory cell array 430 may include a plurality of memory cells coupled to the plurality of word-lines WLs.

Figure 20:
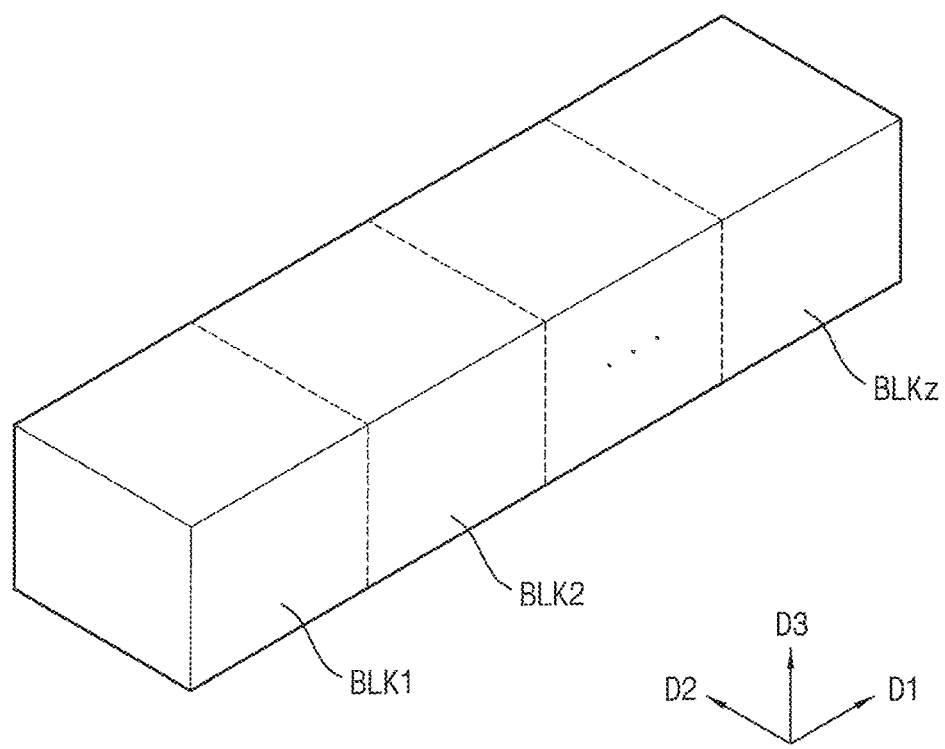
FIG. 20 illustrates a block diagram of the memory cell array in the nonvolatile memory device of FIG. 19.

FIG. 20 illustrates a block diagram of the memory cell array in the nonvolatile memory device of FIG. 19.

Referring to FIG. 19, the memory cell array 430 may include a plurality of memory blocks BLK1 to BLKz (z is an integer greater than two). The memory blocks BLK1 to BLKz extend along a first direction D1, a second direction D2, and a third direction D3. In some example embodiments, the memory blocks BLK1 to BLKz are selected by the address decoder 460 in FIG. 19. For example, the address decoder 460 may select a memory block BLK corresponding to a block address among the memory blocks BLK1 to BLKz.

Figure 21:
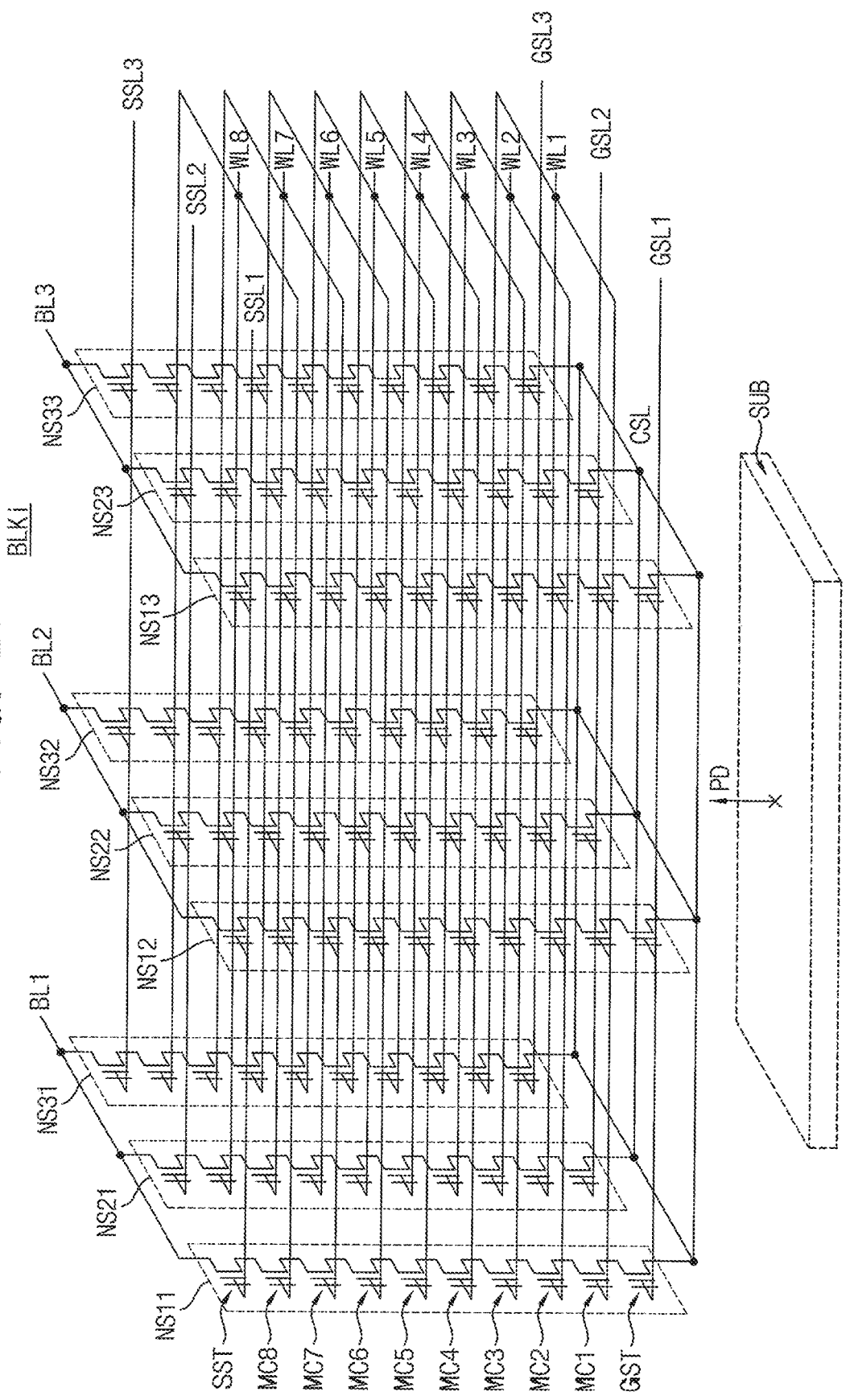
FIG. 21 illustrates a circuit diagram of a memory block of the memory cell array of FIG. 20.

FIG. 21 illustrates a circuit diagram of a memory block of the memory cell array of FIG. 20.

The memory block BLKi of FIG. 21 may be formed on a substrate SUB in a three-dimensional structure (or a vertical structure). For example, a plurality of memory cell strings included in the memory block BLKi may be formed in a direction PD perpendicular to a substrate SUB.

Referring to FIG. 21, the memory block BLKi may include memory cell strings NS11, NS12, NS13, NS21, NS22, NS23, NS31, NS32 and NS33 (which may hereinafter be referred to as memory cell strings NS11 to NS33) coupled between bit-lines BL1, BL2 and BL3 and a common source line CSL. Each of the memory cell strings NS11 to NS33 may include a string selection transistor SST, a plurality of memory cells MC1, MC2, MC3, MC4, MC5, MC6, MC7 and MC8 (which may hereinafter be referred to as memory cells MC1 to MC8), and a ground selection transistor GST. In FIG. 21, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1, SSL2 and SSL3. The plurality of memory cells MC1 to MC8 may be respectively connected to corresponding word-lines WL1, WL2, WL3, WL4, WL5, WL6, WL7 and WL8 (which may hereinafter be referred to as word-lines WL to WL8). The ground selection transistor GST may be connected to corresponding ground selection lines GSL1, GSL2 and GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 21, the memory block BLKi is illustrated to be coupled to eight word-lines WL1 to WL8 and three bit-lines BL1 to BL3. However, example embodiments are not limited thereto. In some example embodiments, the memory cell array 430 may be coupled to any number of word-lines and bit-lines.

Referring back to FIG. 19, the control circuit 450 may receive the command signal CMD and the address signal ADDR from the storage controller 300 and control an erase operation, a program operation, and a read operation of the nonvolatile memory device 400a based on the command signal CMD and the address signal ADDR. The program loop may include program operation and program verification operation and the erase loop may include erase operation and erase verification operation.

For example, the control circuit 450 may generate control signals CTLs, which are used for controlling the voltage generator 470, based on the command signal CMD, and generate a row address R_ADDR and a column address C_ADDR based on the address signal ADDR. The control circuit 450 may provide the row address R_ADDR to the address decoder 460 and provide the column address C_ADDR to the data input/output circuit 420.

In an example embodiment, the address decoder 460 is coupled to the memory cell array 430 through the string selection line SSL, the plurality of word lines WLs, and the ground selection line GSL. During the program operation or the read operation, the address decoder 460 may determine one of the plurality of word-lines WLs as a selected word-line and may determine rest of the plurality of word-lines WLs except the selected word-line as unselected word-lines based on the row address R_ADDR.

In an example embodiment, the voltage generator 470 generates word-line voltages VWLs using the first operation voltage VOP1, which are used for the operation of the nonvolatile memory device 400a, based on the control signals CTLs. The word-line voltages VWLs are applied to the plurality of word-lines WLs through the address decoder 460.

For example, during the erase operation, the voltage generator 470 may apply an erase voltage to a well of the memory block and may apply a ground voltage to entire word-lines (e.g., all word-lines) of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the selected word-line and may apply a program pass voltage to the unselected word-lines. In addition, during the program verification operation, the voltage generator 470 may apply a program verification voltage to the selected word-line and may apply a verification pass voltage to the unselected word-lines. In addition, during the read operation, the voltage generator 470 may apply a read voltage to the selected word-line and may apply a read pass voltage to the unselected word-lines.

In an example embodiment, the page buffer circuit 410 is coupled to the memory cell array 430 through the plurality of bit-lines BLs. The page buffer circuit 410 may include a plurality of page buffers. In an embodiment, one page buffer may be connected to one bit-line. In another embodiment, one page buffer may be connected to two or more bit-lines.

The page buffer circuit 410 may temporarily store data to be programmed in a selected page or data read out from the selected page. The page buffer circuit 410 is controlled in response to a control signal PCTL received from the control circuit 450.

In an example embodiment, the data input/output circuit 420 is coupled to the page buffer circuit 410 through data lines DLs. During the program operation, the data input/output circuit 420 may receive program data DTA from the storage controller 300 and provide the program data DTA to the page buffer circuit 410 based on the column address C_ADDR received from the control circuit 450. During the read operation, the data input/output circuit 420 may provide read data DTA, which is stored in the page buffer circuit 410, to the storage controller 300 based on the column address C_ADDR received from the control circuit 450.

Figure 22:
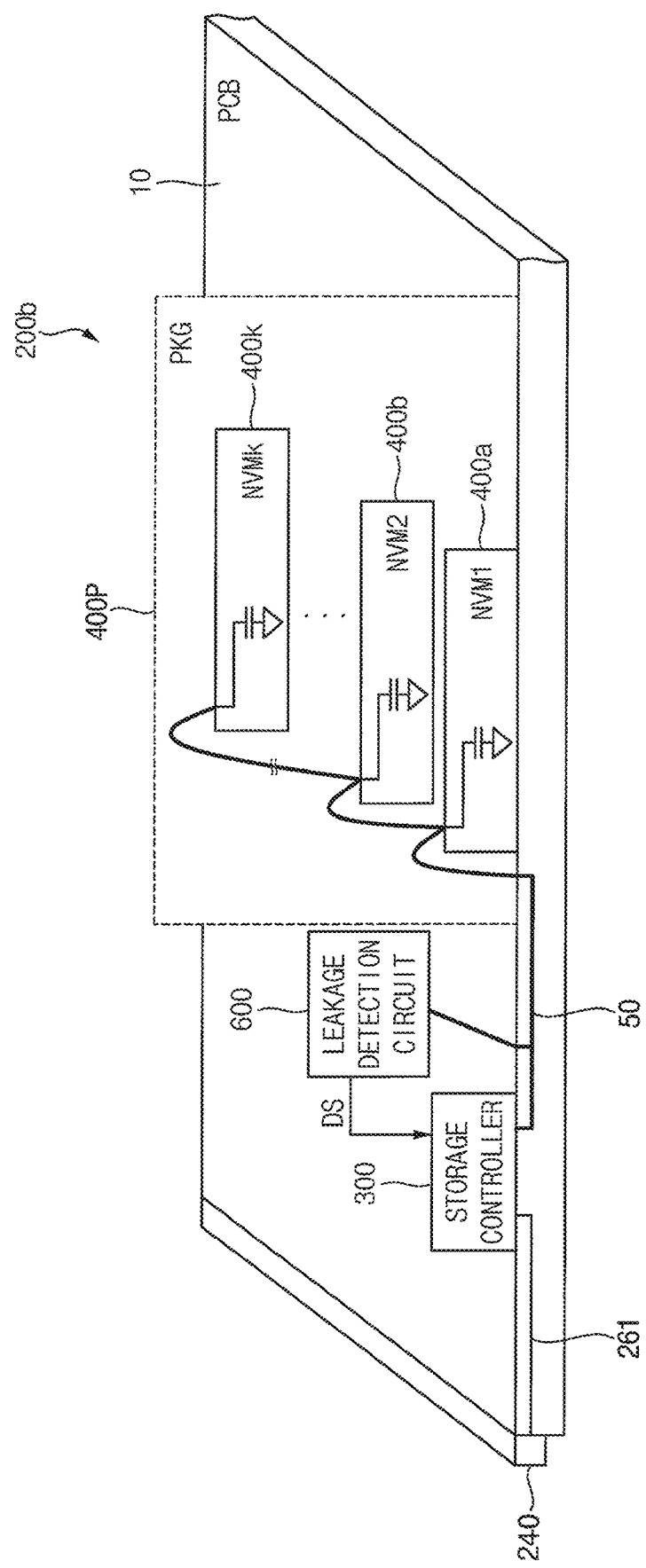
FIG. 22 is a block diagram illustrating an example of a storage device of the storage system of FIG. 1 according to at least some example embodiments of the inventive concepts.

FIG. 22 is a block diagram illustrating an example of a storage device of the storage system of FIG. 1 according to at least some example embodiments of the inventive concepts.

Referring to FIG. 22, a storage device 200b may include a storage controller 300 and a package 400P including a plurality of nonvolatile memory devices 400a~400k provided on the PCB 10. In addition, the storage device 200b may further include a leakage detection circuit 600 provided on the PCB 10.

The storage controller 300 and the nonvolatile memory devices 400a~400k may be electrically coupled to each other through a transmission line 50 which is also referred to as a channel. The storage controller 300 may transmit a command signal and an address signal to the nonvolatile memory devices 400a~400k and may exchange data with the nonvolatile memory devices 400a~400k through the transmission line 50.

The leakage detection circuit 600 may be connected to the storage controller 300 and the nonvolatile memory devices 400a~400k through the transmission line 50, may detect sequentially or concurrently leakage of pins having same attribute of the nonvolatile memory devices 400a~400k and may provide the storage controller 300 with a detection signal DS associated with the leakage.

The storage controller 300 may store leakage information associated with defective pins at which the leakage occurs in a register therein based on the detection signal DS and may adaptively change operation mode of the nonvolatile memory devices 400a~400k based on the leakage information and whether the defective pins are replaceable.

The storage device 200b may further include the conductive pattern, provided as a portion of the PCB 10, which connects the connector 240 and the storage controller 300.

Although in FIG. 22, the storage device 200b is illustrated as including the storage controller 300 and the package 400P including a plurality of nonvolatile memory devices 400a~400k, the storage device 200b may further include other components such as a power supply circuit and/or a volatile memory device, etc.

The storage device 200b may include flash memory based data storage media such as a memory card, a smart card, a universal serial bus (USB) memory, a solid state drive (SSD).

The package 400P may include the nonvolatile memory devices 400a~400k. If the nonvolatile memory devices 400a~400k are contained in the package 400P in the form of multi-stack chip, the stacked nonvolatile memory devices 400a~400k are connected to the storage controller 300 through the same channel.

Figure 23:
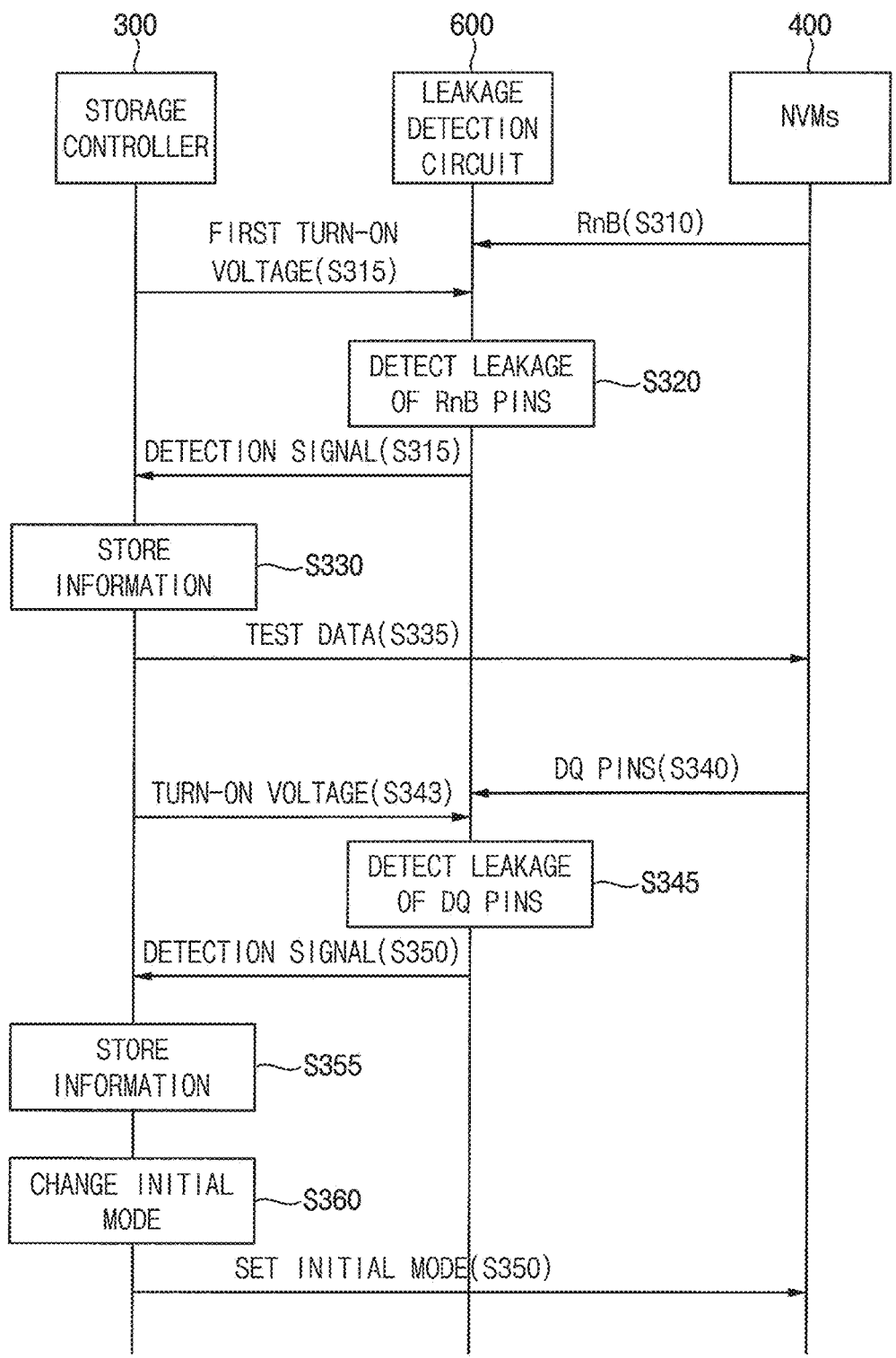
FIG. 23 illustrates an example of operation of a storage device according to at least some example embodiments of the inventive concepts.

FIG. 23 illustrates an example of operation of a storage device according to at least some example embodiments of the inventive concepts.

Referring to FIGS. 3 through 23, there is provided a method of operating the storage device 200 which includes the plurality of nonvolatile memory devices 400a~400k and the storage controller 300 to control the plurality of nonvolatile memory devices 400a~400k. The plurality of nonvolatile memory devices 400a~400k may be collectively nonvolatile memory devices (NVMs) 400.

According to the method, the nonvolatile memory devices 400 transmit the ready/busy signal RnB to corresponding pins in idle state (operation S310). The pin manager 360 in the storage controller 300 applies the first turn-on voltage TON1 to the first selection transistor 531 among the plurality of selection transistors 531~53q (operation S315). Each of the plurality of selection transistors 531~53q is connected to each set of pins having same attribute among pins of the nonvolatile memory devices 400 and each set of pins are commonly connected to respective one of connection terminals of the storage controller 300 at respective one of a plurality of connection nodes CN1~CNq.

The leakage detector 610, connected to the connection nodes CN1~CNq through the selection transistors 531~53q detects leakage (inner leakage/external leakage) of the pins RnBP having a first attribute based on the first merged signal RnBx (operation S320), and provides the detection signal DS to the pin manager 360 in the storage controller 300 (operation S325). When the pin manager 360 determines that the leakage occurs at the pins RnBP having a first attribute, the pin manager 360 stores leakage information associated with the pins RnBP having a first attribute in the register 370 (operation S330).

The storage controller 300 applies test data to data pins DQ0P~DQ7P of the nonvolatile memory devices 400 (operation S335), the nonvolatile memory devices 400 outputs corresponding data to the data pins DQ0P~DQ7P in response to the test data (operation S340), the pin manager 360 applies the turn-on voltage TON3 to the selection transistor 533 among the plurality of selection transistors 53~53q (operation S343).

The leakage detector 610 detects leakage (inner leakage/external leakage) of the data pins DQ0P~DQ7P having a second attribute based on the merged signal DQ0x (operation S340), and provides the detection signal DS to the pin manager 360 in the storage controller 300 (operation S350). When the pin manager 360 determines that the leakage occurs at the data pins DQ0P having a second attribute, the pin manager 360 stores leakage information associated with the data pins DQ0P having a second attribute in the register 370 (S350).

The processor 310 in the storage controller 300 changes initial mode (or, operation mode) of the nonvolatile memory devices 400 based on the leakage information and whether operation modes associated with defective pins at which the leakage occurs are replaceable (operation S360) and sets the changed initial mode (the changed operation mode) in the nonvolatile memory devices 400 (operation S365).

Figure 24:
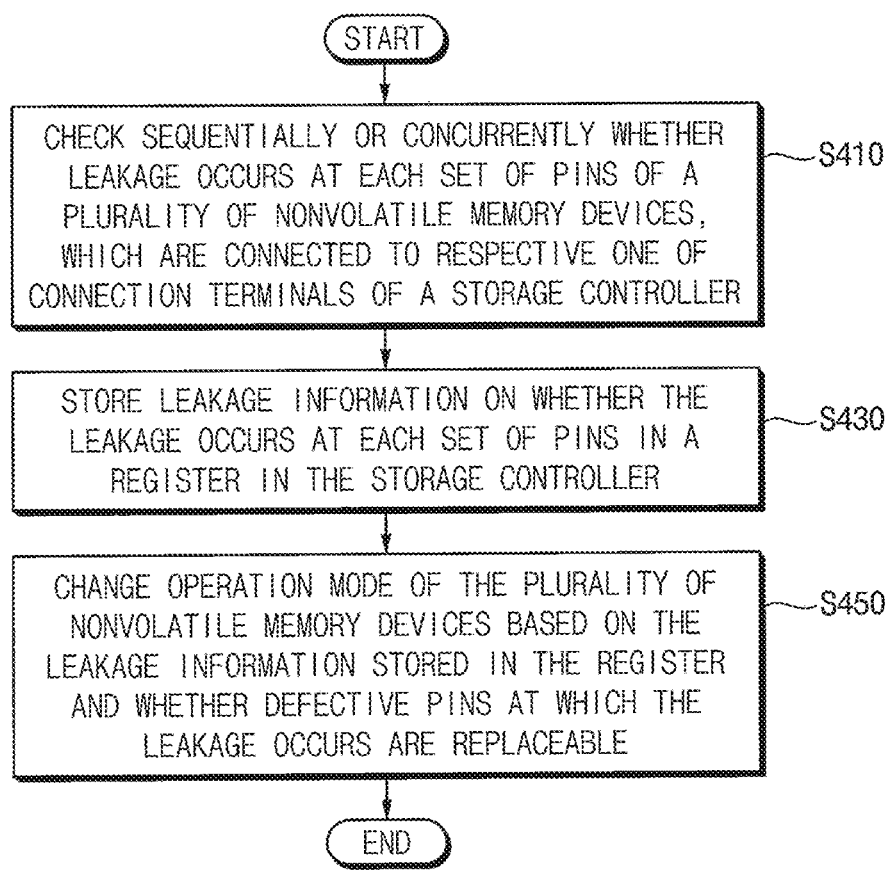
FIG. 24 is a flow chart illustrating a method of operating a storage device according to at least some example embodiments of the inventive concepts.

FIG. 24 is a flow chart illustrating a method of operating a storage device according to at least some example embodiments of the inventive concepts.

Referring to FIGS. 1 through 22 and 24, there is provided a method of operating the storage device 200 which includes the plurality of nonvolatile memory devices 400a~400k and the storage controller 300 to control the plurality of nonvolatile memory devices 400a~400k.

According to the method, the leakage detection circuit 600, connected to the plurality of nonvolatile memory devices 400a~400k and the storage controller 300, checks sequentially or concurrently leakage at each set of pins having same attribute among pins of the nonvolatile memory devices 400a~400k (operation S410). Each set of pins are commonly connected to respective one of connection terminals of the storage controller 300 at respective one of a plurality of connection nodes CN1~CNq.

The pin manager 360 stores leakage information on whether the leakage occurs at each set of pins in the register 370 (operation S430).

The processor 310 in the storage controller 300 changes operation mode of the plurality of nonvolatile memory devices 400a~400k based on leakage information stored in the register 370 and whether operation modes associated with defective pins at which the leakage occurs among the plurality of pins are replaceable (operation S450).

Therefore, in the storage device and method of operating the storage device according to at least some example embodiments of the inventive concepts, the leakage detection circuit, connected to connection nodes which are connected to connection terminals of the storage controller respectively and are connected to each set of pins of a plurality of pins of the nonvolatile memory device respectively, checks sequentially or concurrently leakage at each set of pins having same attribute and changes operation mode of the plurality of nonvolatile memory devices based on leakage information and whether operation modes associated with defective pins at which the leakage occurs among the plurality of pins are replaceable. Therefore, the storage device may enhance performance by changing the operation mode to a mode in which the storage device is not affected by the defective pins at which the leakage occurs.

Figure 25:
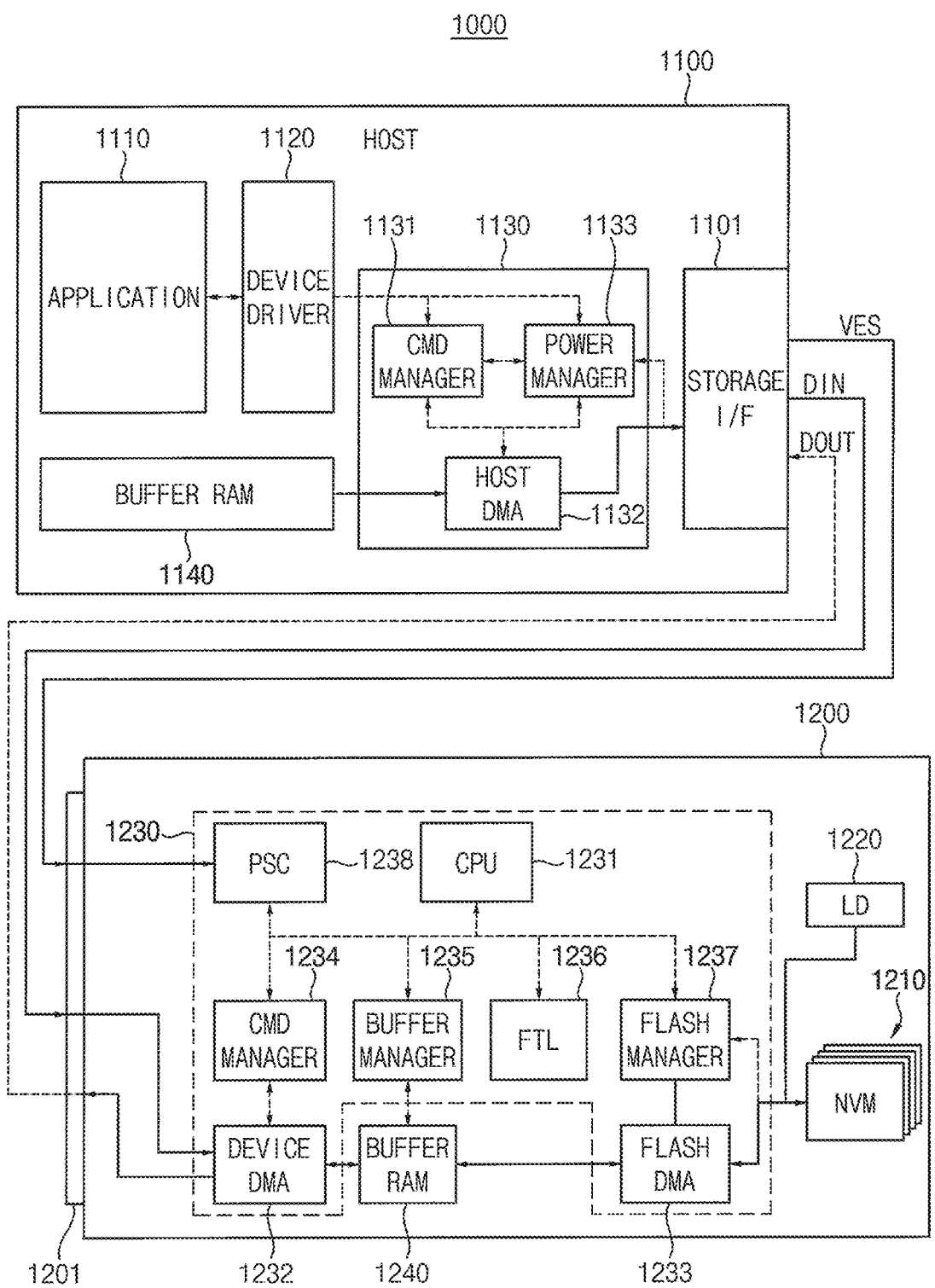
FIG. 25 is a block diagram illustrating a storage system according to at least some example embodiments of the inventive concepts.

FIG. 25 is a block diagram illustrating a storage system according to at least some example embodiments of the inventive concepts.

Referring to FIG. 25, a storage system 1000 may include a host 1100 and a storage device 1200. The storage device 1200 may be connected to the host 1100 through a connector 1201 including a plurality of connection terminals and may communicate with the host 1100. The connector 1201 may include a signal connector and a power connector as described with reference to FIG. 1

The host 1100 includes an application 1110, a device driver 1120, a host controller 1130, and buffer RAM 1140. The host controller 1130 includes a command (CMD) manager 1131, a host direct memory access (DMA) 1132, and a power manager 1133.

In operation, a system level command (e.g., a write command) is generated by the application 1110 and device driver 1120 of the host 1100 and is then provided to the command manager 1131 of the host controller 1130. The command manager 1131 may be used to generate a corresponding storage device command (e.g., a corresponding command or set of commands consistent with a protocol being implemented by the storage system 1000) that is provided to the storage device 1200 using the device driver 1120. The command generated by the command manager 1131 may also be provided to the host DMA 1132 which sends the command to the storage device 1200 via a storage interface 1101.

The storage device 1200 includes flash memory devices (NVM) 1210, a device controller 1230, a buffer random access memory (RAM) 1240 and a leakage detection circuit (LD) 1220. The device controller 1230 may include a Central Processing Unit (CPU) 1231, a device DMA 1232, a flash DMA 1233, a command (CMD) manager 1234, a buffer manager 1235, a flash translation layer (FTL) 1236, a flash manager 1237, and a power supply circuit (PSC) 1238. The power supply circuit 1238 may generate operating voltages based on a power supply voltage VES from the host 1100.

The flash memory devices 1210, the leakage detection circuit 1220, the device controller 1230, and the buffer RAM 1240 may be provided on a PCB.

A command transferred from the host 1100 to storage device 1200 may be provided to the device DMA 1232 via the connector 1201.

The device DMA 1232 may then communicate the received command to the command manager 1234. The command manager 1234 may be used to allocate memory space in the buffer RAM 1240 in order to receive corresponding write data via the buffer manager 1235. Once the storage device 1200 is ready to receive the write data, the command manager 1234 may communicate a transmission "ready" signal to the host 1100.

Upon receiving the transmission ready signal, the host 1100 will communicate the write data to the storage device 1200. The write data may be sent to the storage device 1200 using the host DMA 1132 and storage interface 1101.

The storage device 1200 may then store the received write data in the buffer RAM 1240 using the device DMA 1232 and buffer manager 1235. The write data stored in the buffer RAM 1240 may then be provided to the flash manager 1237 via the flash DMA 1233. The flash manager 1237 may be used to program the write data according to addresses for the flash memory 1210 derived from an address mapping table by the flash translation layer 1236.

Once the transfer and programming of the write data is complete, the storage device 1200 may send a response to the host 1100 informing the host 1100 that the write command has been successfully executed. Based on the received response signal, the host 1100 indicates to the device driver 1120 and application 1110 that the command is complete, and will thereafter terminate execution of the operation corresponding to the command.

As described above, the host 1100 and storage device 1200 may exchange data, corresponding commands and/or control signal(s) (e.g., the ready and response signals) via data lines of the data segment (e.g., data lines DIN and DOUT).

The device controller 1230 exchanges data signals with each of the nonvolatile memory devices (NVM) 1210 through a plurality of signal lines, and the flash DMA 1233 includes a delay circuit and a register according to at least some example embodiments of the inventive concepts. The leakage detection circuit 1220 may be connected to connection terminals of the device controller 1230 and to each set of pins having a same attribute among a plurality of pins of the nonvolatile memory devices 1210 and may check sequentially or concurrently leakage at each set of pins. The device controller 1230 may change operation mode of the nonvolatile memory devices 1210 based on whether leakage occurs and whether operation modes associated with defective pins at which the leakage occurs among the plurality of pins are replaceable. The leakage detection circuit 1220 may employ the leakage detection circuit 600*a* in FIG. 13A or the leakage detection circuit 600*b* in FIG. 13B.

A storage device or a storage system according to at least some example embodiments of the inventive concepts may be packaged using various package types or package configurations.

The at least some example embodiments of the inventive concepts may be applied to various devices and systems that include the storage devices.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A storage device comprising:
   a plurality of nonvolatile memory devices, each including a plurality of pins;
   a storage controller circuit configured to control the plurality of nonvolatile memory devices, wherein the storage controller circuit includes a plurality of connection terminals, each of the plurality of connection terminals is commonly connected to a corresponding set of pins, from among the pluralities of pins included in the plurality of nonvolatile memory devices, via a corresponding connection node, from among a plurality of connection nodes, wherein the pins included in each set of pins have a same attribute, and wherein each connection node from among the plurality of connection nodes is configured to generate a merged signal by merging a plurality of signals; and
   a leakage detection circuit configured to determine whether leakage occurs at each set of pins based on the merged signal generated by the connection node connected to each set of pins, and configured to provide the storage controller circuit with a detection signal indicating a result of the determination,
   wherein the storage controller circuit includes a register and is further configured to,
      store leakage information on whether the leakage occurs at each set of pins in the register, and
      change an operation mode of the plurality of nonvolatile memory devices based on leakage information.

2. The storage device of claim 1,
   wherein the storage controller circuit, the plurality of nonvolatile memory devices and the leakage detection circuit are on a printed circuit board (PCB), and
   wherein the leakage detection circuit comprises:
      a detector circuit connected to a first node, the detector circuit configured to generate the detection signal based on the merged signal generated by a connection node from among the plurality of connection nodes; and
      a plurality of selection transistors connected in parallel between the plurality of connection nodes and the first node, and
      wherein the storage controller circuit is further configured to turn on the plurality of selection transistors sequentially in response to a plurality of turn-on voltages.

3. The storage device of claim 2, wherein the detector circuit further comprises:
   a sensing resistor coupled between a voltage node and the first node;
   a comparator configured to output the detection signal by sequentially comparing a reference voltage with a merged signal generated by one of the plurality of connection nodes;

a multiplexer connected to a voltage terminal; and
a voltage supplier circuit configured to provide a first voltage and a ground voltage to the multiplexer and configured to provide the reference voltage to the comparator, based on an operating voltage,
wherein the multiplexer is configured to, in response to a selection signal,
provide the first voltage to the voltage terminal in a first detection mode, and
provide the ground voltage to the voltage terminal in a second detection mode.

4. The storage device of claim 3,
wherein while the plurality of selection transistors are sequentially connected to the first node,
wherein, the storage controller circuit is configured to, in the first detection mode, determine internal leakage of a portion of each set of pins based one of the merged signals generated by the plurality of connection nodes, and
wherein the storage controller circuit is configured to, in the second detection mode, determine external leakage of a portion of each set of pins based on the merged signal generated by the connection node, from among the plurality of connection nodes, that is connected to each set of pins.

5. The storage device of claim 1, wherein the storage controller circuit comprises:
a pin manager circuit including the register; and
a storage controller processor configured to control the pin manager circuit and configured to adaptively change the operation mode of the plurality of nonvolatile memory devices by referring to the register.

6. The storage device of claim 5, wherein the leakage detection circuit includes:
a detector circuit connected to a first node, the detector circuit configured to generate the detection signal based on the merged signal; and
a plurality of selection transistors connected in parallel between the plurality of connection nodes and the first node, the storage controller circuit being further configured to selectively turn on each of the plurality of selection transistors in response to a plurality of turn-on voltages, and
wherein the pin manager circuit is configured to, based on control of the storage controller processor, sequentially enable the plurality of turn-on voltages and to apply each of the enabled turn-on voltages to a corresponding selection transistor from among the plurality of selection transistors.

7. The storage device of claim 5,
wherein the leakage detection circuit further comprises:
a detector circuit and
plurality of selection transistors,
wherein the plurality of selection transistors include a first selection transistor connected to a first pin from among each of the pluralities of pins of the plurality of nonvolatile memory devices at a first connection node from among the plurality of connection nodes,
wherein each first pin is configured to output a ready/busy signal, and
wherein the first selection transistor is configured to provide the detector circuit with a first merged signal in response to a first turn-on voltage among a plurality of turn-on voltages, the first merged signal being the merged signal generated by the first connection node.

8. The storage device of claim 7, wherein:
the pin manager circuit is further configured to,
determine a leakage of the first pins based on the detection signal during the first selection transistor being turned-on, and
store leakage information associated with the first pins in the register in response to determining that the leakage occurs in at least a portion of the first pins, and
the storage controller processor is configured to change an internal operation status check of each of the nonvolatile memory devices from a first mode based on a level of the ready/busy signal to a second mode based on a command by referring to the register, the operation status check being associated with the first pin.

9. The storage device of claim 7,
wherein the plurality of selection transistors further include a second selection transistor and a third selection transistor,
wherein the second selection transistor is connected to a second pin from among each of the pluralities of pins of the plurality of nonvolatile memory devices at a second connection node from among the plurality of connection nodes,
wherein the second pin is configured to receive a first sub differential signal of a differential signal,
wherein the second selection transistor is configured to provide the detector circuit with a second merged signal in response to a second turn-on voltage among the plurality of turn-on voltages, the second merged signal being the merged signal generated by the second connection node,
wherein the third selection transistor is connected to a third pin from among each of the pluralities of pins of the plurality of nonvolatile memory devices at a third connection node from among the plurality of connection nodes,
wherein the third pins are configured to receive a second sub differential signal of the differential signal, and
wherein the third selection transistor is configured to provide the detector circuit with a third merged signal in response to a third turn-on voltage among the plurality of turn-on voltages, the third merged signal being the merged signal generated by the third connection node.

10. The storage device of claim 9, wherein:
the pin manager circuit is further configured to,
determine a leakage of the second pins based on the detection signal during the second selection transistor being turned-on,
store leakage information associated with the second pins in the register in response to determining that the leakage occurs in at least a portion of the second pins,
determine a leakage of the third pins based on the detection signal during the third selection transistor being turned-on, and
store leakage information associated with the third pins in the register in response to determining that the leakage occurs in at least a portion of the third pins, and
the storage controller processor is configured to change an input/output mode associated with the second pins and the third pins from a differential signal mode to a complementary metal-oxide semiconductor (CMOS) mode in response to determining that the leakage occurs in at least one of the second pins and the third pins.

11. The storage device of claim 10, wherein the differential signal corresponds to one of a read enable signal and a data store signal that each of the nonvolatile memory devices receives from the storage controller circuit.

12. The storage device of claim 7,
wherein the plurality of selection transistors further include a second selection transistor connected to a second pin from among each of the pluralities of pins of the plurality of nonvolatile memory devices at a second connection node among the plurality of connection nodes,
wherein the second pin is configured to input and/or output a first data signal, and
wherein the second selection transistor is configured to provide the detector circuit with a second merged signal in response to a second turn-on voltage among the plurality of turn-on voltages, the second merged signal being the merged signal generated by the second connection node.

13. The storage device of claim 12, wherein:
the pin manager circuit is further configured to,
determine a leakage of the second pins based on the detection signal during the second selection transistor being turned-on, and
store leakage information associated with the second pins in the register in response to determining that the leakage occurs in at least a portion of the second pins,
the storage controller processor is configured to change an input/output mode associated with the second pins and third pins from a first data input/output mode to a second data input/output mode in response to determining that the leakage occurs in at least a portion of the second pins, and
a data width associated with the first data input/output mode is greater than a data width associated with the second data input/output mode.

14. The storage device of claim 1,
wherein the storage controller circuit, the plurality of nonvolatile memory devices and the leakage detection circuit are on a printed circuit board (PCB), and
wherein the leakage detection circuit comprises:
a plurality of detector circuits connected to a plurality of first nodes, each of the plurality of detector circuits configured to generate a bit from among a plurality of bits of the detection signal based on a corresponding merged from among the merged signals generated by the plurality of connection nodes; and
a plurality of selection transistors connected in parallel between each of the connection nodes and corresponding nodes from among the first nodes, the storage controller circuit being further configured to simultaneously turn on the plurality of selection transistors in response to a plurality of turn-on voltages.

15. The storage device of claim 14, wherein each of the plurality of detector circuits comprises:
a sensing resistor coupled between a voltage node and a corresponding node from among the first nodes;
a comparator configured to output a bit of the detection signal by comparing a corresponding reference voltage from among a plurality of reference voltages with a merged signal from among the merged signals generated by the plurality of connection nodes;
a multiplexer connected to a voltage terminal; and
a voltage supplier circuit configured to provide a first voltage and a ground voltage to the multiplexer and configured to provide the corresponding reference voltage to the comparator, based on an operating voltage,
wherein the multiplexer, in response to a selection signal, is configured to provide the first voltage to the voltage terminal in a first detection mode and configured to provide the ground voltage to the voltage terminal in a second detection mode.

16. The storage device of claim 15, wherein the plurality of reference voltages have levels associated, respectively, with the merged signals generated by the plurality of connection nodes.

17. The storage device of claim 1,
wherein the connection terminals correspond to solder balls of the storage controller circuit, and
wherein storage controller circuit is further configured to perform a leakage detection operation on the plurality of pins of each of the nonvolatile memory devices in response to a power applied to the storage controller circuit before a power-up sequence is performed.

18. The storage device of claim 1,
wherein the connection terminals correspond to solder balls of the storage controller circuit, and
wherein the storage controller circuit is further configured to periodically perform a leakage detection operation on the plurality of pins of each of the nonvolatile memory devices in an idle state of the nonvolatile memory devices or in a power management mode of the nonvolatile memory devices.

19. A method of operating a storage device, wherein the storage device includes a plurality of nonvolatile memory devices and a storage controller circuit configured to control the plurality of nonvolatile memory devices, the method comprising:
checking, sequentially or concurrently, by a leakage detection circuit connected to the plurality of nonvolatile memory devices and the storage controller circuit, whether leakage occurs at each of a plurality of sets of pins,
the storage controller circuit including a plurality of connection terminals,
each of the plurality of connection terminals being commonly connected to each pin in a corresponding set of pins, from among the plurality of sets of pins, through a corresponding connection node, from among a plurality of connection nodes,
each nonvolatile memory device from among the plurality of nonvolatile memory devices including a plurality of pins,
each set of pins including pins from among the pluralities of pins included in the plurality of nonvolatile memory devices,
each set of pins including pins having a same attribute;
storing leakage information on whether the leakage occurs at each set of pins in a register in the storage controller circuit; and
changing an operation mode of the plurality of nonvolatile memory devices based on leakage information stored in the register and whether operation modes associated with defective pins at which the leakage occurs among the plurality of pins of each of the nonvolatile memory devices are replaceable.

20. A storage device comprising:
a plurality of nonvolatile memory devices provided on a printed circuit board (PCB), each including a plurality of pins;

a storage controller circuit provided on the PCB, the storage controller circuit being configured to control the plurality of nonvolatile memory devices, the storage controller circuit including a plurality of connection terminals, each of the plurality of connection terminals being commonly connected to each pin in a corresponding set of pins, from among a plurality of sets of pins, through a corresponding connection node, from among a plurality of connection nodes, each nonvolatile memory device from among the plurality of nonvolatile memory devices including a plurality of pins, each set of pins including pins from among the pluralities of pins included in the plurality of nonvolatile memory devices, each set of pins including pins having a same attribute; and a leakage detection circuit provided on the PCB, the leakage detection circuit being configured to determine whether leakage occurs at each set of pins based on a corresponding merged signal from among a plurality of merged signals generated, respectively, by the plurality of connection nodes, and configured to provide the storage controller circuit with a detection signal indicating a result of the determination, wherein the storage controller circuit includes a register and is configured to,
  store leakage information on whether the leakage occurs at each set of pins in the register, and
  adaptively change an operation mode of the plurality of nonvolatile memory devices based on leakage information, wherein the leakage detection circuit comprises:
  a detector circuit connected to a first node, the detector circuit being configured to generate the detection signal based on a merged signal from among the plurality of merged signals; and
  a plurality of selection transistors connected in parallel between the plurality of connection nodes and the first node, the storage controller circuit being further configured to sequentially turn on a plurality of selection transistors in response to a plurality of turn-on voltages, and wherein the storage controller circuit comprises:
  a pin manager circuit including the register; and
  a storage controller processor configured to control the pin manager circuit and configured to adaptively change the operation mode of the plurality of nonvolatile memory devices by referring to the register.

* * * * *